United States Patent
Kim et al.

(10) Patent No.: US 11,716,854 B2
(45) Date of Patent: Aug. 1, 2023

(54) THREE-DIMENSIONAL SEMICONDUCTOR MEMORY DEVICE

(71) Applicant: Samsung Electronics Co., Ltd., Suwon-si (KR)

(72) Inventors: Jiyoung Kim, Hwaseong-si (KR); Woosung Yang, Gwangmyeong-si (KR); Sejie Takaki, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 217 days.

(21) Appl. No.: 17/024,105

(22) Filed: Sep. 17, 2020

(65) Prior Publication Data

US 2021/0217765 A1   Jul. 15, 2021

(30) Foreign Application Priority Data

Jan. 15, 2020 (KR) .................. 10-2020-0005384

(51) Int. Cl.
| | |
|---|---|
| *H10B 43/40* | (2023.01) |
| *G11C 7/18* | (2006.01) |
| *H01L 23/522* | (2006.01) |
| *H10B 41/10* | (2023.01) |
| *H10B 41/27* | (2023.01) |
| *H10B 41/43* | (2023.01) |

(Continued)

(52) U.S. Cl.
CPC ............. *H10B 43/40* (2023.02); *G11C 7/18* (2013.01); *H01L 23/5226* (2013.01); *H10B 41/10* (2023.02); *H10B 41/27* (2023.02); *H10B 41/43* (2023.02); *H10B 43/10* (2023.02); *H10B 43/27* (2023.02)

(58) Field of Classification Search
CPC ......... H01L 27/11573; H01L 27/11578; H01L 27/11575; H10B 43/40; H10B 43/10; H10B 43/27; H10B 41/10; H10B 41/27; H10B 41/43
See application file for complete search history.

(56) References Cited

U.S. PATENT DOCUMENTS

| | | |
|---|---|---|
| 8,933,502 B2 | 1/2015 | Higashitani et al. |
| 9,281,317 B2 | 3/2016 | Higashitani et al. |
| 9,455,263 B2 | 9/2016 | Zhang et al. |

(Continued)

FOREIGN PATENT DOCUMENTS

| | | |
|---|---|---|
| KR | 10-2015-0106660 A | 9/2015 |
| KR | 10-2019-0056717 A | 5/2019 |

OTHER PUBLICATIONS

US 11,462,559 B2, 10/2022, Choi (withdrawn)*

*Primary Examiner* — David A Zarneke
(74) *Attorney, Agent, or Firm* — Harness, Dickey & Pierce, P.L.C.

(57) ABSTRACT

A 3D semiconductor memory device includes a peripheral circuit structure on a first substrate, a second substrate on the peripheral circuit structure, an electrode structure on the second substrate, the electrode structure comprising stacked electrodes, and a vertical channel structure penetrating the electrode structure. The peripheral circuit structure includes a dummy interconnection structure under the second substrate. The dummy interconnection structure includes stacked interconnection lines, and a via connecting a top surface of an uppermost one of the interconnection lines to a bottom surface of the second substrate.

20 Claims, 32 Drawing Sheets

(51) Int. Cl.
*H10B 43/10* (2023.01)
*H10B 43/27* (2023.01)

(56) References Cited

U.S. PATENT DOCUMENTS

| | | | |
|---|---|---|---|
| 9,508,730 B2 * | 11/2016 | Lee | H01L 27/11565 |
| 9,953,993 B2 * | 4/2018 | Utsumi | H01L 27/11519 |
| 9,985,098 B2 | 5/2018 | Matsumoto et al. | |
| 10,199,359 B1 | 2/2019 | Sakakibara et al. | |
| 10,319,680 B1 * | 6/2019 | Sei | H01L 27/11556 |
| 10,777,520 B2 * | 9/2020 | Lee | H01L 27/11529 |
| 10,840,260 B2 * | 11/2020 | Kai | H01L 23/5226 |
| 11,049,834 B2 * | 6/2021 | Wang | H01L 21/76895 |
| 11,462,503 B2 * | 10/2022 | Wang | H01L 27/11568 |
| 2014/0085979 A1 * | 3/2014 | Kono | H01L 27/11582 |
| | | | 365/185.11 |
| 2015/0263011 A1 | 9/2015 | Hong | |
| 2018/0374866 A1 | 12/2018 | Makala et al. | |
| 2019/0035733 A1 * | 1/2019 | Park | H01L 27/11575 |
| 2019/0157284 A1 | 5/2019 | Park et al. | |
| 2019/0157294 A1 | 5/2019 | Kanamori et al. | |
| 2019/0164983 A1 | 5/2019 | Hu et al. | |
| 2019/0181226 A1 | 6/2019 | Choi et al. | |

* cited by examiner

THREE-DIMENSIONAL SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2020-0005384, filed on Jan. 15, 2020, in the Korean Intellectual Property Office, the disclosure of which is hereby incorporated by reference in its entirety.

BACKGROUND

Example embodiments of the inventive concepts relate to a semiconductor device and, more particularly, to a three-dimensional (3D) semiconductor memory device with improved electrical characteristics.

Semiconductor devices have been more highly integrated to provide improved performance and/or lower manufacturing costs. The integration density of semiconductor devices directly affects the costs of the semiconductor devices, thereby resulting in a demand of more highly integrated semiconductor devices. The integration density of typical two-dimensional (2D) or planar semiconductor devices may be mainly determined by an area where a unit memory cell occupies. Therefore, the integration density of the typical 2D semiconductor devices may be affected by a technique of forming finer patterns. However, since higher-priced apparatuses are needed to form finer patterns, the integration density of 2D semiconductor devices continues to increase but is still limited. Thus, three-dimensional (3D) semiconductor memory devices have been developed to overcome the above limitations. 3D semiconductor memory devices may include memory cells three-dimensionally arranged.

SUMMARY

Example embodiments of the inventive concepts may provide a three-dimensional (3D) semiconductor memory device with improved electrical characteristics.

In an aspect, a 3D semiconductor memory device may include a peripheral circuit structure on a first substrate, a second substrate on the peripheral circuit structure, an electrode structure on the second substrate, the electrode structure comprising stacked electrodes, and a vertical channel structure penetrating the electrode structure. The peripheral circuit structure may include a dummy interconnection structure under the second substrate. The dummy interconnection structure may include stacked interconnection lines, and a via connecting a top surface of an uppermost one of the interconnection lines to a bottom surface of the second substrate.

In an aspect, a 3D semiconductor memory device may include a peripheral circuit structure on a first substrate, a second substrate on the peripheral circuit structure, an electrode structure on the second substrate, the electrode structure comprising stacked electrodes, and a vertical channel structure penetrating the electrode structure. The peripheral circuit structure may include a dummy interconnection structure under the second substrate. The dummy interconnection structure may include stacked interconnection layers. An uppermost one of the interconnection layers may include a first interconnection line and a second interconnection line. The first and second interconnection lines may be electrically connected to the second substrate. The first and second interconnection lines may be spaced apart from each other by an interlayer insulating layer therebetween.

In an aspect, a 3D semiconductor memory device may include a peripheral circuit structure on a first substrate, the peripheral circuit structure comprising a peripheral transistor on the first substrate, an interconnection structure on the peripheral transistor, and a dummy interconnection structure adjacent to the interconnection structure, a second substrate on the peripheral circuit structure, an electrode structure on the second substrate, the electrode structure comprising stacked electrodes, a plurality of vertical channel structures penetrating the electrode structure, the vertical channel structures electrically connected to the second substrate, conductive pads on the vertical channel structures, respectively, an interlayer insulating layer covering the electrode structure, bit lines on the interlayer insulating layer and electrically connected to the conductive pads, and a through-contact penetrating the interlayer insulating layer so as to be connected to the interconnection structure. Each of the vertical channel structures may include a filling insulation pattern having a pillar shape, a vertical semiconductor pattern covering an outer surface of the filling insulation pattern, and a data storage layer between the vertical semiconductor pattern and the electrodes. The dummy interconnection structure may include a first interconnection layer and a second interconnection layer on the first interconnection layer, the second interconnection layer between the first interconnection layer and the second substrate, a first via vertically connecting the first interconnection layer to the second interconnection layer, and a second via vertically connecting the second interconnection layer to the second substrate.

In an aspect, a 3D semiconductor memory device may include a peripheral circuit structure on a first substrate, a second substrate on the peripheral circuit structure, the second substrate having a first sidewall and a second sidewall which are opposite to each other in a first direction, a cutting hole penetrating the second substrate, the cutting hole extending in the first direction between the first and second sidewalls, the cutting hole defining an inner sidewall of the second substrate, a first conductive spacer on the inner sidewall, an electrode structure on the second substrate, the electrode structure comprising stacked electrodes, and a vertical channel structure penetrating the electrode structure.

BRIEF DESCRIPTION OF THE DRAWINGS

The inventive concepts will become more apparent in view of the attached drawings and accompanying detailed description.

DETAILED DESCRIPTION OF EXAMPLE EMBODIMENTS

Figure 1:
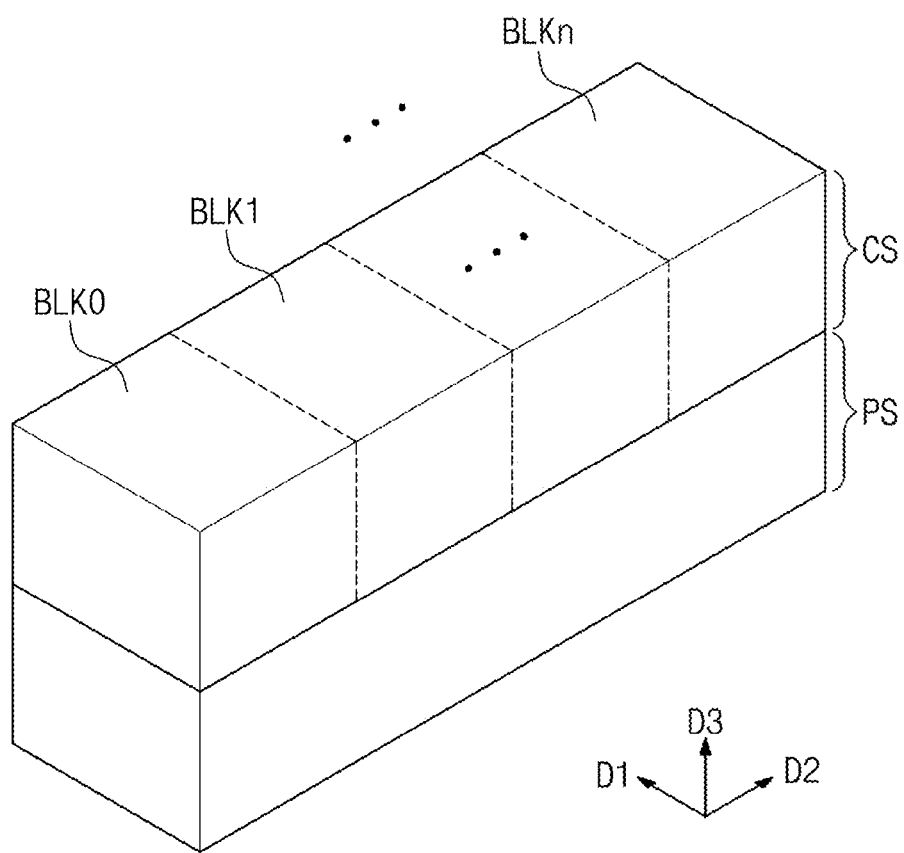
FIG. 1 is a schematic perspective view illustrating a three-dimensional (3D) semiconductor memory device according to some example embodiments of the inventive concepts.

FIG. 1 is a schematic perspective view illustrating a three-dimensional (3D) semiconductor memory device according to some example embodiments of the inventive concepts.

Referring to FIG. 1, a 3D semiconductor memory device according to some example embodiments of the inventive concepts may include a peripheral circuit structure PS, a cell array structure CS on the peripheral circuit structure PS, and/or a through-contact (not shown) vertically connecting the cell array structure CS and the peripheral circuit structure PS. The cell array structure CS may overlap with the peripheral circuit structure PS when viewed in a plan view.

In some example embodiments, the peripheral circuit structure PS may include peripheral logic circuits including row and column decoders, a page buffer, and/or control circuits. The peripheral logic circuits constituting the peripheral circuit structure PS may be integrated on a semiconductor substrate.

The cell array structure CS may include a cell array including a plurality of memory cells three-dimensionally arranged. For example, the cell array structure CS may include a plurality of memory blocks BLK0 to BLKn. Each of the memory blocks BLK0 to BLKn may include three-dimensionally arranged memory cells.

Figure 2:
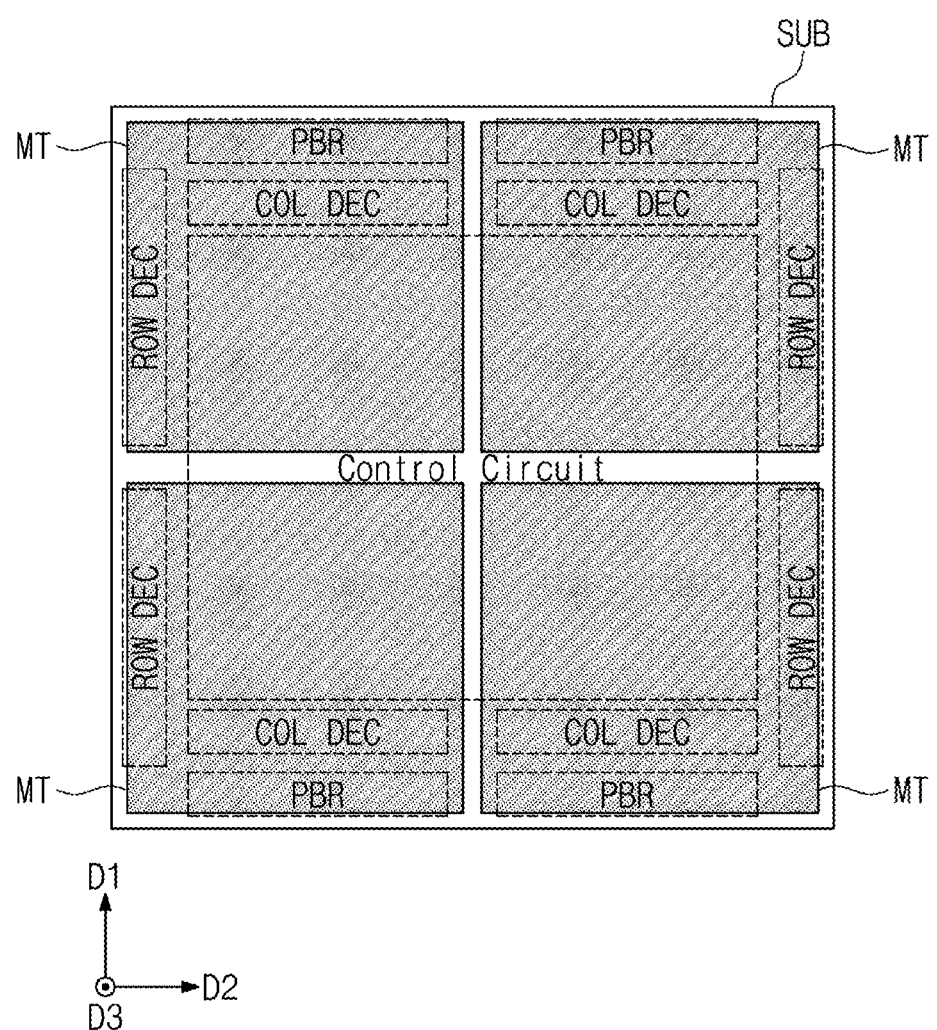
FIG. 2 is a schematic plan view illustrating a 3D semiconductor memory device according to some example embodiments of the inventive concepts.

FIG. 2 is a schematic plan view illustrating a 3D semiconductor memory device according to some example embodiments of the inventive concepts.

Referring to FIGS. 1 and 2, the peripheral circuit structure PS and the cell array structure CS described with reference to FIG. 1 may be disposed on a first substrate SUB.

In each of chip regions 10, the row and column decoders ROW DEC and COL DEC, the page buffer PBR and the control circuit which constitute the peripheral circuit structure PS of FIG. 1 may be disposed on the first substrate SUB.

A plurality of mats MT constituting the cell array structure CS of FIG. 1 may be disposed on the first substrate SUB. The mats MT may be arranged in a first direction D1 and a second direction D2. Each of the mats MT may include the memory blocks BLK0 to BLKn described above with reference to FIG. 1.

The mats MT may overlap with the peripheral circuit structure PS (see FIG. 1). According to some example embodiments of the inventive concepts, the peripheral logic circuits constituting the peripheral circuit structure PS (see FIG. 1) may be freely disposed under the mats MT.

Figure 3:
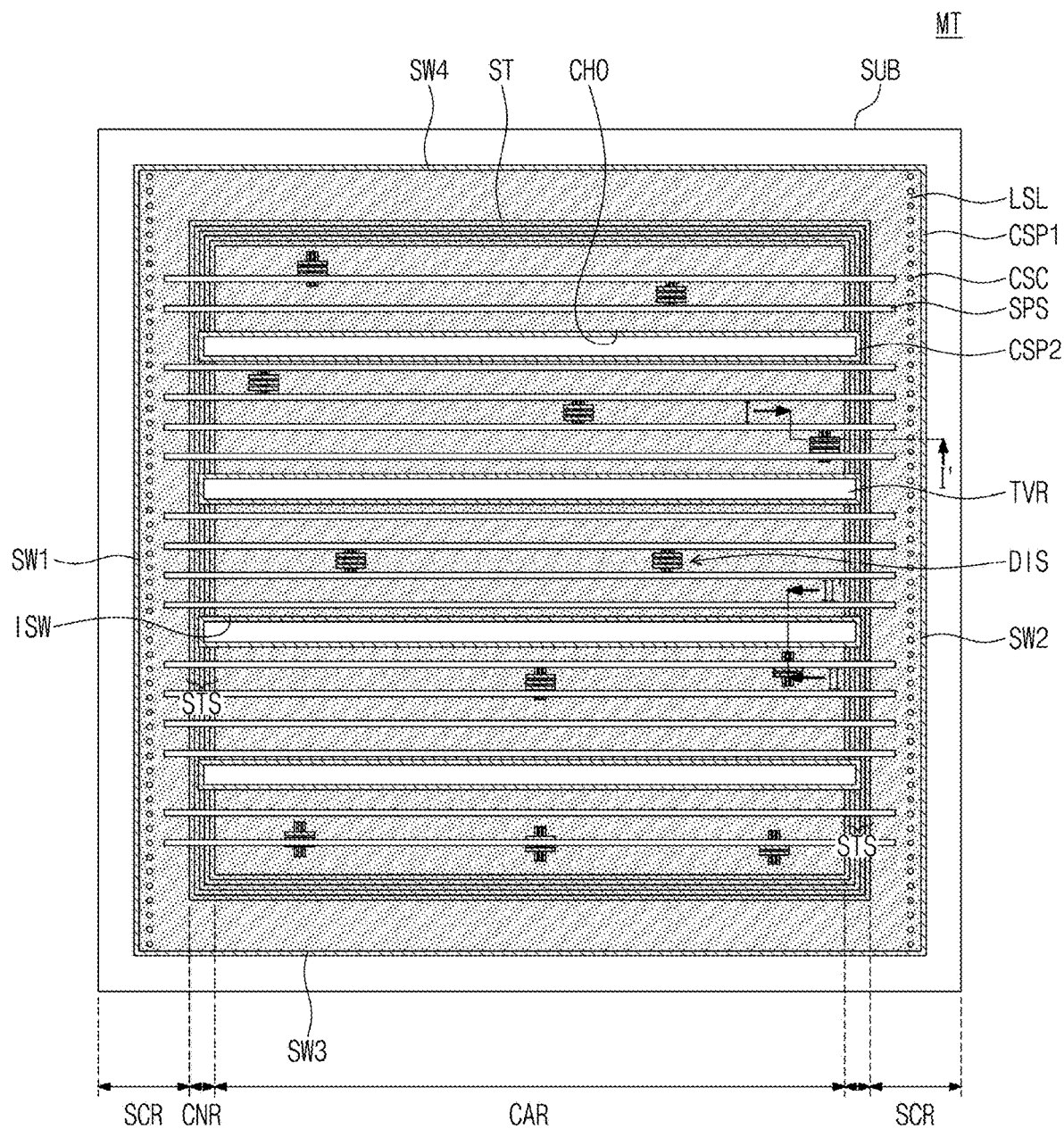
FIG. 3 is a plan view illustrating a 3D semiconductor memory device according to some example embodiments of the inventive concepts.
Figure 4A:
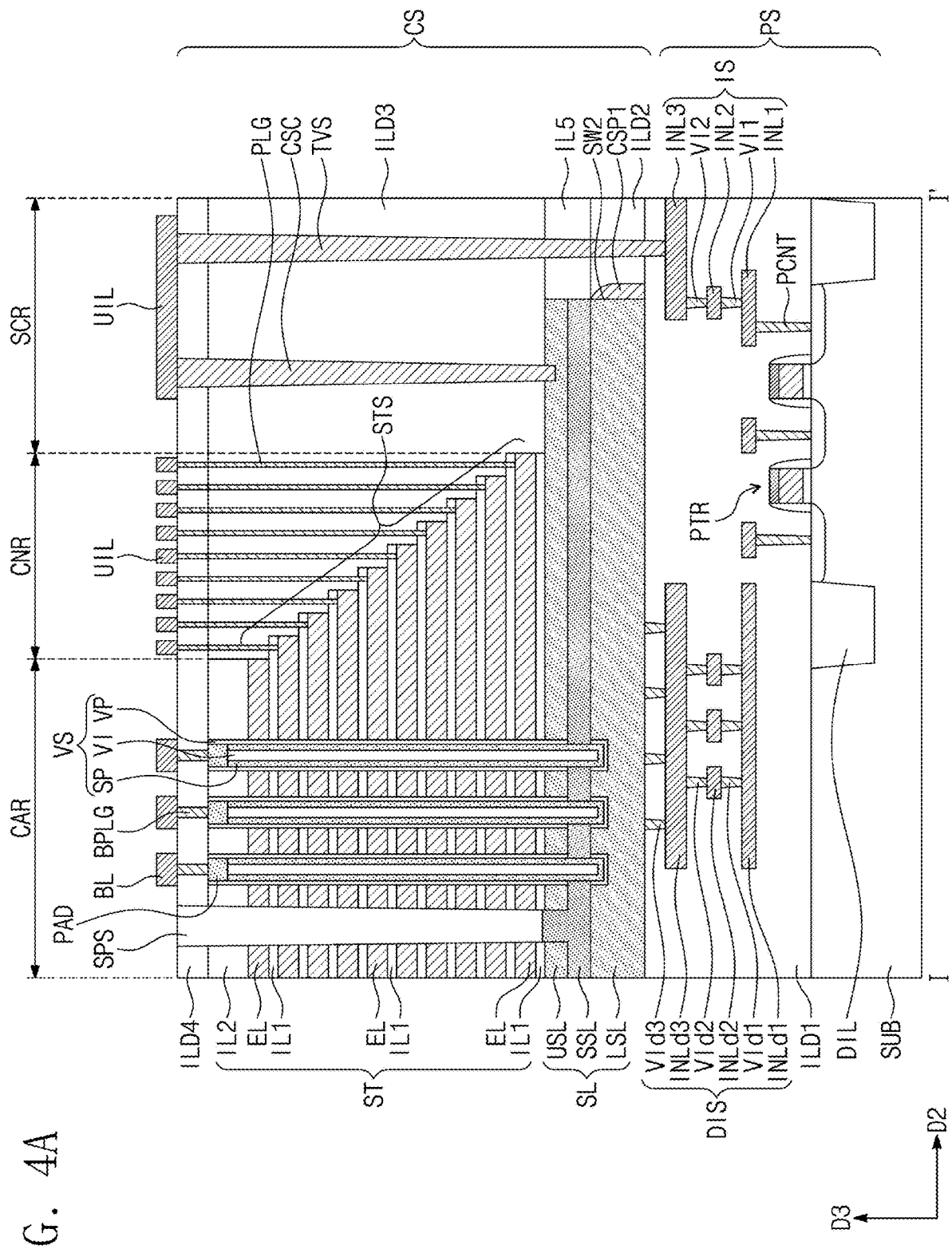
FIGS. 4A and 4B are cross-sectional views taken along lines I-I' and II-II' of FIG. 3, respectively.
Figure 4B:
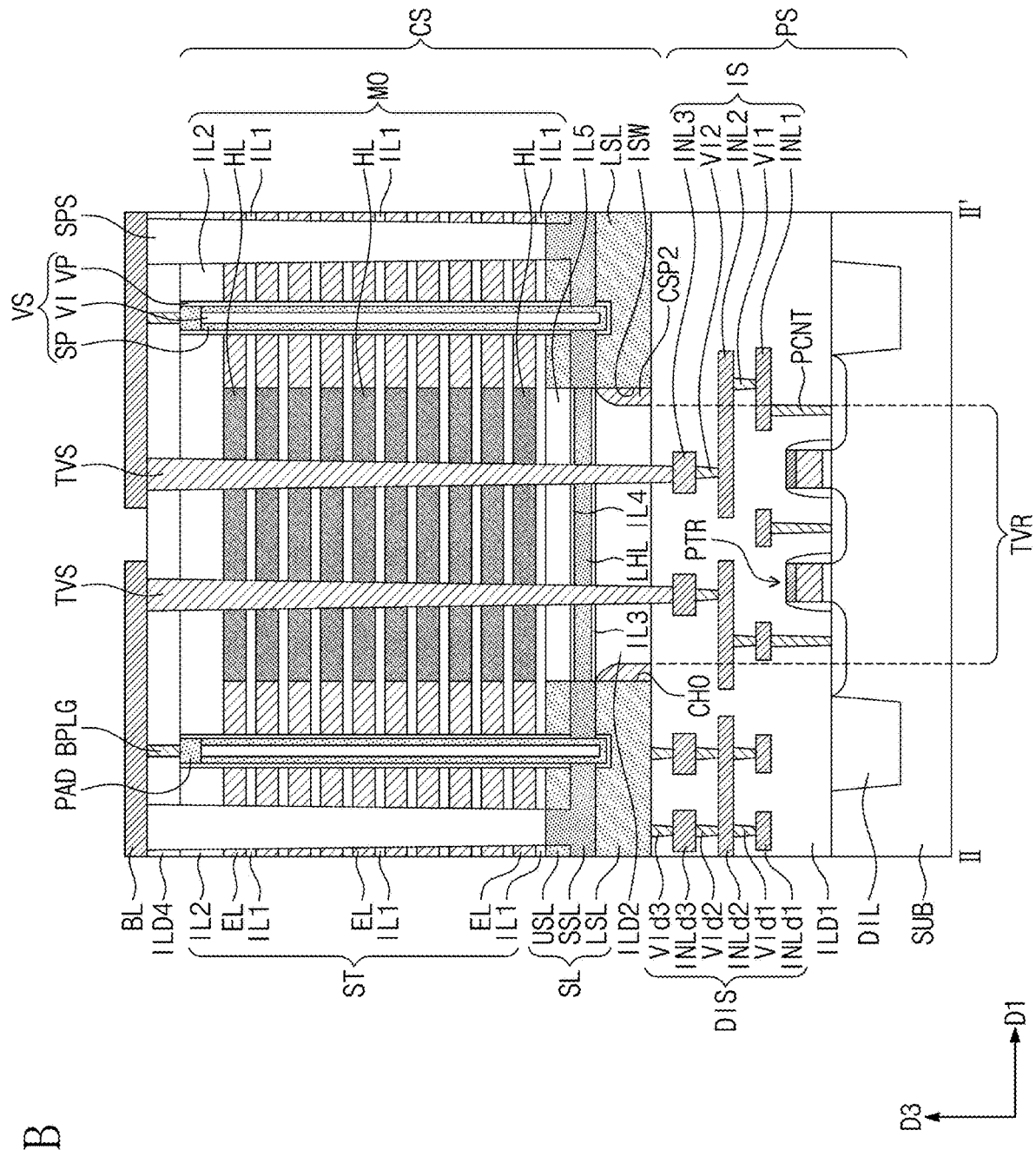

FIG. 3 is a plan view illustrating a 3D semiconductor memory device according to some example embodiments of the inventive concepts. FIGS. 4A and 4B are cross-sectional views taken along lines I-I' and II-II' of FIG. 3, respectively. FIG. 3 illustrates one of the mats MT (see FIG. 2) of a 3D semiconductor memory device according to some example embodiments of the inventive concepts.

Referring to FIGS. 3, 4A and 4B, a peripheral circuit structure PS including peripheral transistors PTR may be disposed on a first substrate SUB. A cell array structure CS including an electrode structure ST may be disposed on the peripheral circuit structure PS. The first substrate SUB may include a silicon substrate, a silicon-germanium substrate, a germanium substrate, or a single-crystalline epitaxial layer grown on a single-crystalline silicon substrate. The first substrate SUB may include active regions defined by a device isolation layer DIL.

The peripheral circuit structure PS may include a plurality of the peripheral transistors PTR disposed on the active regions of the first substrate SUB. The peripheral transistors PTR may constitute the aforementioned peripheral logic circuits including the row and column decoders, the page buffer, and/or the control circuit.

The peripheral circuit structure PS may include an interconnection structure IS provided on the peripheral transistors PTR. The interconnection structure IS may include a plurality of interconnection layers stacked on the first substrate SUB. For example, the interconnection layers may include a first interconnection layer including first interconnection lines INL1, a second interconnection layer including second interconnection lines INL2, and a third interconnection layer including third interconnection lines INL3. A peripheral contact PCNT may be provided between the first interconnection line INL1 and the peripheral transistor PTR to electrically connect the first interconnection line INL1 and the peripheral transistor PTR.

For example, the first interconnection lines INL1 may extend in the second direction D2 in parallel to each other. The second interconnection lines INL2 may extend in parallel to each other in the first direction D1 intersecting the second direction D2. The third interconnection lines INL3 may extend in the second direction D2 in parallel to each other. The first interconnection lines INL1 may be arranged in the first direction D1 at a first pitch. The second interconnection lines INL2 may be arranged in the second direction D2 at a second pitch. The third interconnection lines INL3 may be arranged in the first direction D1 at a third pitch. The first to third pitches may be equal to each other or may be different from each other. A width of the first interconnection line INL1, a width of the second interconnection line INL2 and a width of the third interconnection line INL3 may be equal to each other or may be different from each other.

The interconnection structure IS may further include a first via VI1 provided between the first interconnection line INL1 and the second interconnection line INL2, and a second via VI2 provided between the second interconnection line INL2 and the third interconnection line INL3. The first to third interconnection lines INL1, INL2 and INL3 may be vertically connected to each other through the first and second vias VI1 and VI2.

The peripheral circuit structure PS may further include a dummy interconnection structure DIS. The dummy interconnection structure DIS may include portions of the first to third interconnection layers described above in the interconnection structure IS. The dummy interconnection structure DIS may include first dummy interconnection lines INLd1 provided in the first interconnection layer, second dummy interconnection lines INLd2 provided in the second interconnection layer, and third dummy interconnection lines INLd3 provided in the third interconnection layer. Detailed descriptions to the first to third dummy interconnection lines INLd1, INLd2 and INLd3 may be the same or substantially the same as described above in the first to third interconnection lines INL1, INL2 and INL3. However, the first dummy interconnection lines INLd1 may not be connected to the peripheral transistor PTR, unlike the first interconnection lines INL1 described above. In other words, the dummy interconnection structure DIS may not be connected to the peripheral transistor PTR and may be a dummy not performing a specific circuit function.

The dummy interconnection structure DIS may further include a first dummy via VId1 provided between the first dummy interconnection line INLd1 and the second dummy interconnection line INLd2, a second dummy via VId2 provided between the second dummy interconnection line INLd2 and the third dummy interconnection line INLd3, and a third dummy via VId3 provided between the third dummy interconnection line INLd3 and a lower semiconductor layer LSL to be described later.

The first to third dummy interconnection lines INLd1, INLd2 and INLd3 may be vertically connected to each other through the first and second dummy vias VId1 and VId2. The dummy interconnection structure DIS may be connected to the lower semiconductor layer LSL through at least one third dummy via VId3. For example, the third dummy via VID3 may connect a top surface of the third dummy interconnection line INLd3 and a bottom surface of the lower semiconductor layer LSL.

The dummy interconnection structure DIS may be provided in plurality under a second substrate SL when viewed in a plan view. The plurality of dummy interconnection structures DIS may be substantially uniformly distributed under the second substrate SL. The dummy interconnection structures DIS may be used to make a pattern density uniform when the interconnection structures IS are formed. When the pattern density is uniform, process failure occurring in a photolithography process may be reduced or minimized.

The interconnection structure IS and the dummy interconnection structure DIS may be formed at the same time by the same process. Each of the interconnection structure IS and the dummy interconnection structure DIS may include a metal such as tungsten, copper, or aluminum. Since the dummy interconnection structure DIS is electrically connected to the lower semiconductor layer LSL through the at least one third dummy via VId3, the second substrate SL may obtain an effect that a metal is attached to a bottom thereof, for example, a resistance reduction effect to be described later.

The peripheral circuit structure PS may further include a first interlayer insulating layer ILD1 covering the peripheral transistors PTR, the interconnection structure IS, and the dummy interconnection structure DIS. The first interlayer insulating layer ILD1 may include stacked insulating layers. For example, the first interlayer insulating layer ILD1 may include at least one of a silicon oxide layer, a silicon nitride layer, a silicon oxynitride layer, or a low-k dielectric layer. The first interlayer insulating layer ILD1 may be disposed between the third dummy interconnection lines INLd3, and thus the third dummy interconnection lines INLd3 adjacent to each other may be separated from each other by the first interlayer insulating layer ILD1 (see FIG. 4B). The first interlayer insulating layer ILD1 may be disposed between the third dummy vias VId3, and thus the third dummy vias VId3 adjacent to each other may be separated from each other by the first interlayer insulating layer ILD1 (see FIG. 4B).

The cell array structure CS may be provided on the first interlayer insulating layer ILD1 of the peripheral circuit structure PS. Hereinafter, the cell array structure CS will be described in more detail. A second interlayer insulating layer ILD2 and the second substrate SL may be provided on the first interlayer insulating layer ILD1. The second substrate SL may be provided in the second interlayer insulating layer ILD2. For example, the second substrate SL may have a rectangular plate shape forming a lower portion of the mat MT. The second substrate SL may support the electrode structure ST provided thereon.

The second substrate SL may include the lower semiconductor layer LSL, a source semiconductor layer SSL and/or an upper semiconductor layer USL, which are sequentially stacked. Each of the lower semiconductor layer LSL, the source semiconductor layer SSL and/or the upper semiconductor layer USL may include a semiconductor material (e.g., silicon (Si), germanium (Ge), silicon-germanium (SiGe), gallium-arsenic (GaAs), indium-gallium-arsenic (InGaAs), aluminum-gallium-arsenic (AlGaAs), or any combination thereof). Each of the lower semiconductor layer LSL, the source semiconductor layer SSL and/or the upper semiconductor layer USL may be single-crystalline, amorphous and/or poly-crystalline. For example, each of the lower semiconductor layer LSL, the source semiconductor layer SSL and the upper semiconductor layer USL may include an N-type poly-silicon layer doped with dopants. Dopant concentrations of the lower semiconductor layer LSL, the source semiconductor layer SSL and the upper semiconductor layer USL may be different from each other.

The source semiconductor layer SSL may be disposed between the lower semiconductor layer LSL and the upper semiconductor layer USL. The lower semiconductor layer LSL and the upper semiconductor layer USL may be electrically connected to each other through the source semiconductor layer SSL. For example, the upper semiconductor layer USL and the source semiconductor layer SSL may overlap with the lower semiconductor layer LSL when viewed in a plan view.

Referring to FIG. 3, the lower semiconductor layer LSL may include first to fourth sidewalls SW1 to SW4 when viewed in a plan view. The first and second sidewalls SW1 and SW2 may extend in the first direction D1. The first and second sidewalls SW1 and SW2 may be opposite to each other in the second direction D2. The third and fourth sidewalls SW3 and SW4 may extend in the second direction D2. The third and fourth sidewalls SW3 and SW4 may be opposite to each other in the first direction D1.

The second substrate SL may include a cell array region CAR, a connection region CNR, and/or a source connection region SCR. The cell array region CAR may be provided in a central portion of the second substrate SL. A pair of the connection regions CNR may be provided at both sides of the cell array region CAR, respectively. The pair of connection regions CNR may extend in the first direction D1. A pair of the source connection regions SCR may be provided adjacent to the first and second sidewalls SW1 and SW2 of the lower semiconductor layer LSL, respectively. The pair of source connection regions SCR may extend in the first direction D1.

Referring to FIGS. 3 and 4B, the lower semiconductor layer LSL may have a plurality of cutting holes CHO. Each of the cutting holes CHO may have a bar shape extending in the second direction D2. The cutting holes CHO may be arranged in the first direction D1. Each of the cutting holes CHO may penetrate the lower semiconductor layer LSL. A bottom surface of the second interlayer insulating layer ILD2 filling the cutting hole CHO may be in contact with a top surface of the first interlayer insulating layer ILD1. A through-contact region TVR of the cell array structure CS may be defined by the cutting hole CHO.

A first conductive spacer CSP1 may be provided on the first to fourth sidewalls SW1 to SW4 of the lower semiconductor layer LSL. A second conductive spacer CSP2 may be provided on an inner sidewall ISW of the lower semiconductor layer LSL, which is defined by the cutting hole CHO. The first conductive spacer CSP1 may selectively cover the first to fourth sidewalls SW1 to SW4 of the lower semiconductor layer LSL. The second conductive spacer CSP2 may selectively cover the inner sidewalls ISW of the lower semiconductor layer LSL. The first and second conductive spacers CSP1 and CSP2 may not cover the bottom surface and the top surface of the lower semiconductor layer LSL. The first and second conductive spacers CSP1 and CSP2 may include a metal such as tungsten, copper, or aluminum.

Referring again to FIG. 4B, a third insulating layer IL3, a lower sacrificial layer LHL and a fourth insulating layer IL4 may be sequentially stacked on the through-contact region TVR. The third insulating layer IL3, the lower sacrificial layer LHL and the fourth insulating layer IL4 may be provided at the same level as the source semiconductor layer SSL. For example, a bottom surface of the third insulating layer IL3 may be coplanar with a bottom surface of the source semiconductor layer SSL, and a top surface of the fourth insulating layer IL4 may be coplanar with a top surface of the source semiconductor layer SSL.

A fifth insulating layer IL5 may be provided on the through-contact region TVR. The fifth insulating layer IL5 may be provided on the fourth insulating layer IL4. The fifth insulating layer IL5 may be provided at the same level as the upper semiconductor layer USL. For example, a bottom surface of the fifth insulating layer IL5 may be coplanar with a bottom surface of the upper semiconductor layer USL, and a top surface of the fifth insulating layer IL5 may be coplanar with a top surface of the upper semiconductor layer USL. As illustrated in FIG. 4A, the fifth insulating layer IL5 may also be disposed on the second interlayer insulating layer ILD2 of the source connection region SCR. A bottom surface of the fifth insulating layer IL5 of the source connection region SCR may be located at a lower level than the bottom surface of the upper semiconductor layer USL.

Referring to FIGS. 3, 4A and 4B, the electrode structure ST may be provided on the second substrate SL. The electrode structure ST may include electrodes EL stacked in a vertical direction (e.g., a third direction D3) on the second substrate SL. The electrode structure ST may further include first insulating layers IL1 separating the stacked electrodes EL from each other. The first insulating layers IL1 and the electrodes EL of the electrode structure ST may be alternately stacked in the third direction D3.

The electrode structure ST may extend from the cell array region CAR of the second substrate SL onto the connection region CNR of the second substrate SL. The electrode structure ST may have a staircase structure STS on the connection region CNR. A height of the staircase structure STS of the electrode structure ST may become less from the cell array region CAR toward the source connection region SCR.

The lowermost electrode EL of the electrode structure ST may be a lower selection line. The uppermost electrode EL of the electrode structure ST may be an upper selection line. The other electrodes EL except the lower and upper selection lines may be word lines.

The electrodes EL may include a conductive material. For example, the electrodes EL may include at least one of a doped semiconductor material (e.g., doped silicon), a metal (e.g., tungsten, copper, or aluminum), a conductive metal nitride (e.g., titanium nitride or tantalum nitride), or a transition metal (e.g., titanium or tantalum). For example, each of the first insulating layers IL1 may include a silicon oxide layer.

The electrode structure ST on the cell array region CAR may further include a second insulating layer IL2. The second insulating layer IL2 may be selectively provided on the cell array region CAR but may not be provided on the connection region CNR. A thickness of the second insulating layer IL2 may be greater than a thickness of the first insulating layer ILL The second insulating layer IL2 may include the same insulating material as the first insulating layer ILL For example, the second insulating layer IL2 may include a silicon oxide layer.

A plurality of vertical channel structures VS penetrating the electrode structure ST may be provided on the cell array region CAR. The vertical channel structures VS may be arranged in the second direction D2. Each of the vertical channel structures VS may include a vertical insulating pattern VP, a vertical semiconductor pattern SP, and/or a filling insulation pattern VI. The vertical semiconductor pattern SP may be disposed between the vertical insulating pattern VP and the filling insulation pattern VI. A conductive pad PAD may be provided on each of the vertical channel structures VS.

The filling insulation pattern VI may have a cylindrical shape. The vertical semiconductor pattern SP may cover a surface of the filling insulation pattern VI and may extend from the lower semiconductor layer LSL to the conductive pad PAD in the third direction D3. The vertical semiconductor pattern SP may have a pipe shape having an opened top end. The vertical insulating pattern VP may cover an outer surface of the vertical semiconductor pattern SP and may extend from the lower semiconductor layer LSL to a top surface of the second insulating layer IL2 in the third direction D3. The vertical insulating pattern VP may also have a pipe shape having an opened top end. The vertical insulating pattern VP may be disposed between the electrode structure ST and the vertical semiconductor pattern SP.

The vertical insulating pattern VP may be formed of a single layer or a multi-layer. In some example embodiments, the vertical insulating pattern VP may include a data storage layer. For example, the vertical insulating pattern VP may be a data storage layer of a NAND flash memory device and may include a tunnel insulating layer, a charge storage layer, and a blocking insulating layer.

For example, the charge storage layer may include a trap insulating layer, a floating gate electrode, and/or an insulating layer including conductive nano dots. The charge storage layer may include at least one of a silicon nitride layer, a silicon oxynitride layer, a silicon-rich nitride layer, a nano-crystalline silicon layer, or a laminated trap layer. The tunnel insulating layer may include a material of which an energy band gap is greater than that of the charge storage layer. For example, the tunnel insulating layer may include at least one of a high-k dielectric layer (e.g., an aluminum oxide layer or a hafnium oxide layer) or a silicon oxide layer. The blocking insulating layer may include at least one of a high-k dielectric layer (e.g., an aluminum oxide layer or a hafnium oxide layer) or a silicon oxide layer.

The vertical semiconductor pattern SP may include a semiconductor material such as silicon (Si), germanium (Ge), or a combination thereof. In addition, the vertical semiconductor pattern SP may include a semiconductor material doped with dopants or an intrinsic semiconductor material not doped with dopants. The vertical semiconductor pattern SP including the semiconductor material may be used as channels of transistors constituting a NAND cell string.

The conductive pad PAD may cover a top surface of the vertical semiconductor pattern SP and a top surface of the filling insulation pattern VI. The conductive pad PAD may include a semiconductor material doped with dopants, and/or a conductive material. A bit line contact plug BPLG may be electrically connected to the vertical semiconductor pattern SP through the conductive pad PAD.

The source semiconductor layer SSL may be in direct contact with a sidewall of a lower portion of each of the vertical semiconductor patterns SP. The source semiconductor layer SSL may electrically connect a plurality of the vertical semiconductor patterns SP to each other. In other words, the vertical semiconductor patterns SP may be electrically connected together to the second substrate SL. The second substrate SL may function as sources of memory cells. A common source voltage may be applied to the second substrate SL, as described later.

A plurality of separation structures SPS may penetrate the electrode structure ST. The separation structures SPS may extend in the second direction D2 in parallel to each other. For example, each of the electrodes EL of the electrode structure ST may be horizontally divided into a plurality of electrodes EL by the separation structures SPS. The plurality of electrodes EL divided by the separation structures SPS may extend in the second direction D2 in parallel to each other. The separation structures SPS may include an insulating material such as silicon oxide.

The 3D semiconductor memory device according to some example embodiments of the inventive concepts may be a 3D NAND flash memory device. NAND cell strings may be integrated at the electrode structure ST on the lower semiconductor layer LSL. In other words, the electrode structure ST and the vertical channel structures VS penetrating the electrode structure ST may constitute memory cells three-dimensionally arranged on the second substrate SL. The electrodes EL of the electrode structure ST may be used as gate electrodes of transistors.

Referring to FIG. 4B, the electrode structure ST may include a mold structure MO provided on each of the through-contact regions TVR. The mold structure MO may extend along the through-contact region TVR in the second direction D2 when viewed in a plan view.

The mold structure MO may include sacrificial layers HL stacked on the fifth insulating layer IL5 in the third direction D3. The mold structure MO may further include the first insulating layers IL1 separating the stacked sacrificial layers HL from each other. The first insulating layers IL1 and the sacrificial layers HL of the mold structure MO may be alternately stacked in the third direction D3.

The sacrificial layers HL may be provided at the same levels as the electrodes EL of the electrode structure ST, respectively. In other words, the sacrificial layer HL of the mold structure MO may physically connect the electrodes EL adjacent to each other in the first direction D1. The sacrificial layers HL may include an insulating material such as silicon nitride or silicon oxynitride. Since the first insulating layers IL1, the second insulating layer IL2 and the sacrificial layers HL are formed of the insulating materials, the mold structure MO may be an insulator.

Referring to FIGS. 3, 4A and 4B, a third interlayer insulating layer ILD3 may be provided on the second substrate SL. The third interlayer insulating layer ILD3 may cover the staircase structure STS of the electrode structure ST. A fourth interlayer insulating layer ILD4 may be provided on the third interlayer insulating layer ILD3.

Bit line contact plugs BPLG may penetrate the fourth interlayer insulating layer ILD4 so as to be connected to the conductive pads PAD, respectively. A plurality of bit lines BL may be disposed on the fourth interlayer insulating layer ILD4. The bit lines BL may extend in the first direction D1 in parallel to each other. Each of the bit lines BL may be electrically connected to the vertical semiconductor pattern SP through the bit line contact plug BPLG.

Cell contact plugs PLG may penetrate the third and fourth interlayer insulating layers ILD3 and ILD4 so as to be connected to the electrodes EL constituting the staircase structure STS, respectively. A plurality of upper interconnection lines UIL may be disposed on the fourth interlayer insulating layer ILD4. Each of the upper interconnection lines UIL may be electrically connected to the electrode EL through the cell contact plug PLG.

Referring to FIG. 4B, at least one through-contact TVS may be provided to penetrate each of the through-contact region TVR. The through-contact TVS of the through-contact region TVR may penetrate the fourth interlayer insulating layer ILD4, the mold structure MO, the fifth insulating layer IL5, the fourth insulating layer IL4, the lower sacrificial layer LHL, the third insulating layer IL3 and the second interlayer insulating layer ILD2 so as to be electrically connected to the third interconnection line INL3 of the peripheral circuit structure PS. For example, the through-contact TVS of the through-contact region TVR may electrically connect the bit line BL to the peripheral circuit structure PS.

Referring to FIGS. 3 and 4A, a plurality of common source contacts CSC may be provided on the source connection region SCR. The common source contacts CSC may be adjacent to the first and second sidewalls SW1 and SW2 of the lower semiconductor layer LSL. The common source contacts CSC may be arranged in the first direction D1. Each of the common source contacts CSC may penetrate the fourth interlayer insulating layer ILD4 and the third interlayer insulating layer ILD3 so as to be connected to the second substrate SL.

Through-contacts TVS may further be provided on the source connection region SCR. The through-contact TVS of the source connection region SCR may be adjacent to the common source contact CSC in the second direction D2. The through-contact TVS of the source connection region SCR may penetrate the fourth interlayer insulating layer ILD4, the third interlayer insulating layer ILD3, the fifth insulating layer IL5 and the second interlayer insulating layer ILD2 so as to be electrically connected to the third interconnection line INL3 of the peripheral circuit structure PS.

The peripheral transistors PTR disposed under the source connection region SCR may constitute a common source line driver for supplying a common source voltage. In other words, the through-contact TVS of the source connection region SCR may be connected directly to the common source line driver of the peripheral circuit structure PS.

An upper interconnection line UIL on the source connection region SCR may connect the common source contact CSC and the through-contact TVS adjacent to each other. As a result, the common source line driver of the peripheral circuit structure PS may be electrically connected to the second substrate SL through the through-contact TVS, the upper interconnection line UIL and the common source contact CSC. The common source voltage may be applied to portions adjacent to the first and second sidewalls SW1 and SW2 of the lower semiconductor layer LSL by the common source line driver.

The vertical channel structure VS located on a center of the cell array region CAR may be relatively far from the first or second sidewall SW1 or SW2 of the lower semiconductor layer LSL. Since the common source voltage is applied to the portions adjacent to the first and second sidewalls SW1 and SW2 of the lower semiconductor layer LSL, an electrical path through which the common source voltage is transmitted to the vertical channel structure VS located on the center of the cell array region CAR may be relatively long. The relatively long electrical path may increase a resistance. Since the resistance is increased, electrical characteristics of a semiconductor memory device may be deteriorated.

However, according to example embodiments of the inventive concepts in FIG. 3, the second conductive spacer CSP2 formed of a low-resistance metal material may be provided on the inner sidewall ISW of the lower semiconductor layer LSL. Since the second conductive spacer CSP2 extends in the second direction D2 between the first and second sidewalls SW1 and SW2 of the lower semiconductor layer LSL, a resistance of the electrical path may be reduced by the second conductive spacer CSP2.

The dummy interconnection structures DIS formed of a low-resistance metal material may be provided under the lower semiconductor layer LSL. The dummy interconnection structures DIS may be substantially uniformly distributed under the second substrate SL, and thus a resistance of the second substrate SL may be reduced.

As a result, according to example embodiments of the inventive concepts, the resistance of the second substrate SL may be reduced to reduce noise which may occur when transmitting the common source voltage. In addition, the common source voltage may be uniformly applied to the vertical channel structures VS connected to the second substrate SL. Thus, electrical characteristics of the 3D semiconductor memory device according to example embodiments of the inventive concepts may be improved.

FIGS. 5A, 6A, 7A, 8A, 9A, 10A and 11A are cross-sectional views taken along the line I-I' of FIG. 3 to illustrate a method of manufacturing a 3D semiconductor memory device, according to some example embodiments of the inventive concepts. FIGS. 5B, 6B, 7B, 8B, 9B, 10B and 11B are cross-sectional views taken along the line II-II' of FIG. 3 to illustrate a method of manufacturing a 3D semiconductor memory device, according to some example embodiments of the inventive concepts.

Figure 5A:
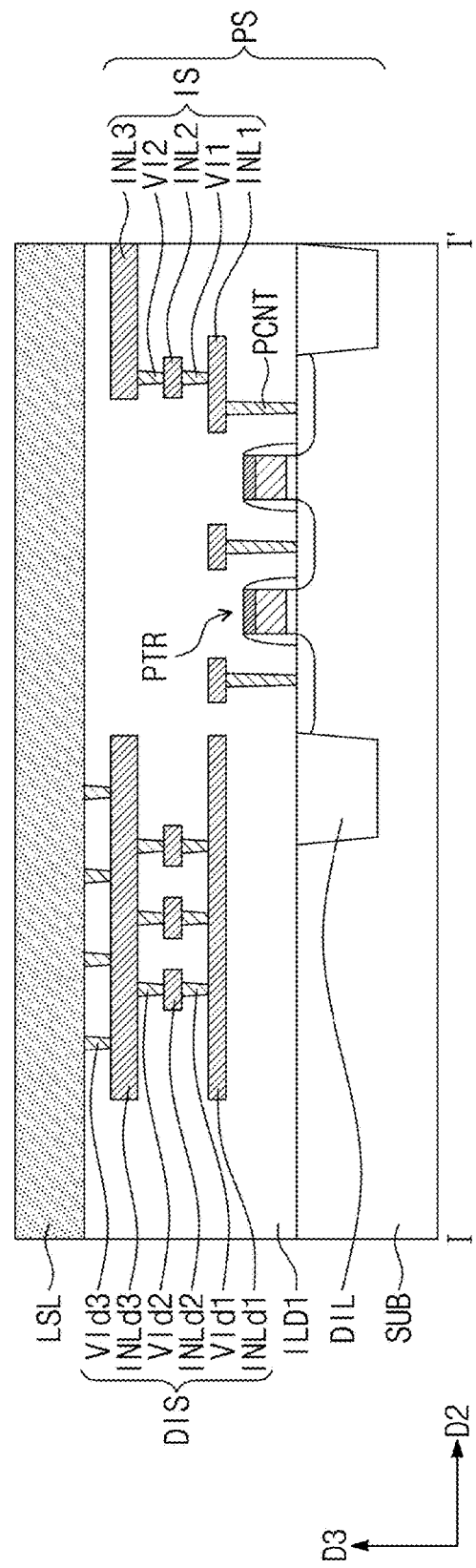
FIGS. 5A, 6A, 7A, 8A, 9A, 10A and 11A are cross-sectional views taken along the line I-I' of FIG. 3 to illustrate a method of manufacturing a 3D semiconductor memory device, according to some example embodiments of the inventive concepts.
Figure 5B:
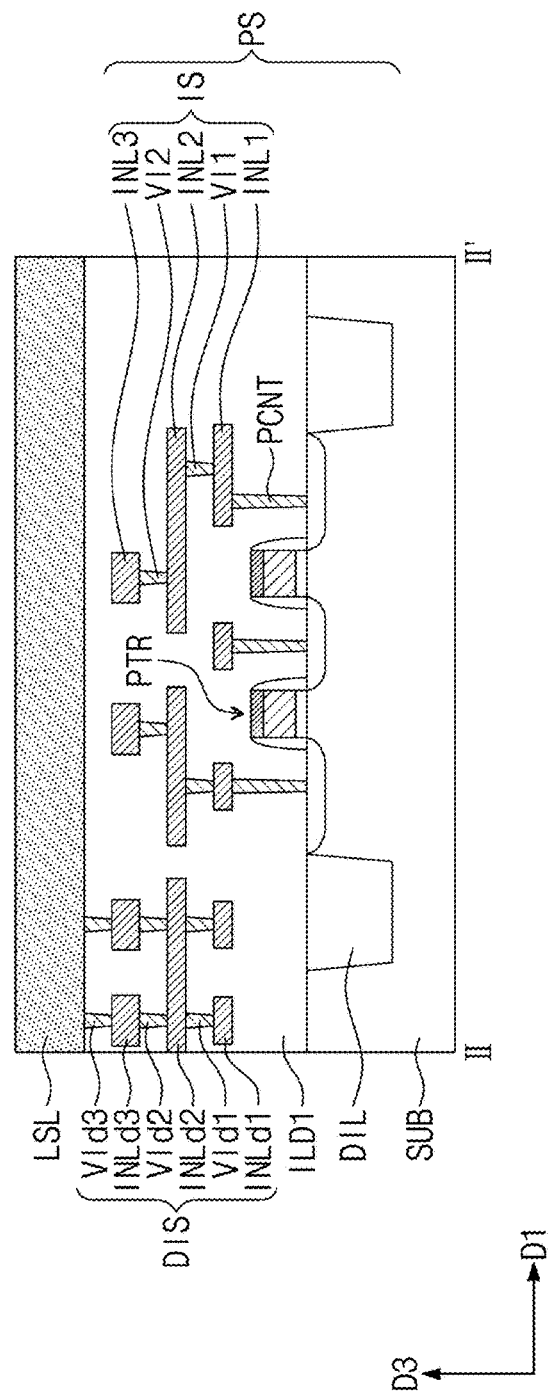
FIGS. 5B, 6B, 7B, 8B, 9B, 10B and 11B are cross-sectional views taken along the line II-II' of FIG. 3 to illustrate a method of manufacturing a 3D semiconductor memory device, according to some example embodiments of the inventive concepts.

Referring to FIGS. 3, 5A and 5B, a peripheral circuit structure PS may be formed on a first substrate SUB. The formation of the peripheral circuit structure PS may include forming peripheral transistors PTR on the first substrate SUB, forming an interconnection structure IS on the peripheral transistors PTR, and forming a dummy interconnection structure DIS on the peripheral transistors PTR. The dummy interconnection structure DIS may further include third dummy vias VId3 formed on third dummy interconnection lines INLd3.

For example, the formation of the peripheral transistors PTR may include forming a device isolation layer DIL in the first substrate SUB to define active regions, forming a gate insulating layer and gate electrodes on the active regions, and injecting dopants into the active regions to form source/drain regions.

A first interlayer insulating layer ILD1 covering the peripheral transistors PTR, the interconnection structure IS and/or the dummy interconnection structure DIS may be formed. A lower semiconductor layer LSL may be formed on the first interlayer insulating layer ILD1. The lower semiconductor layer LSL may include a semiconductor material such as poly-silicon.

Figure 6A:
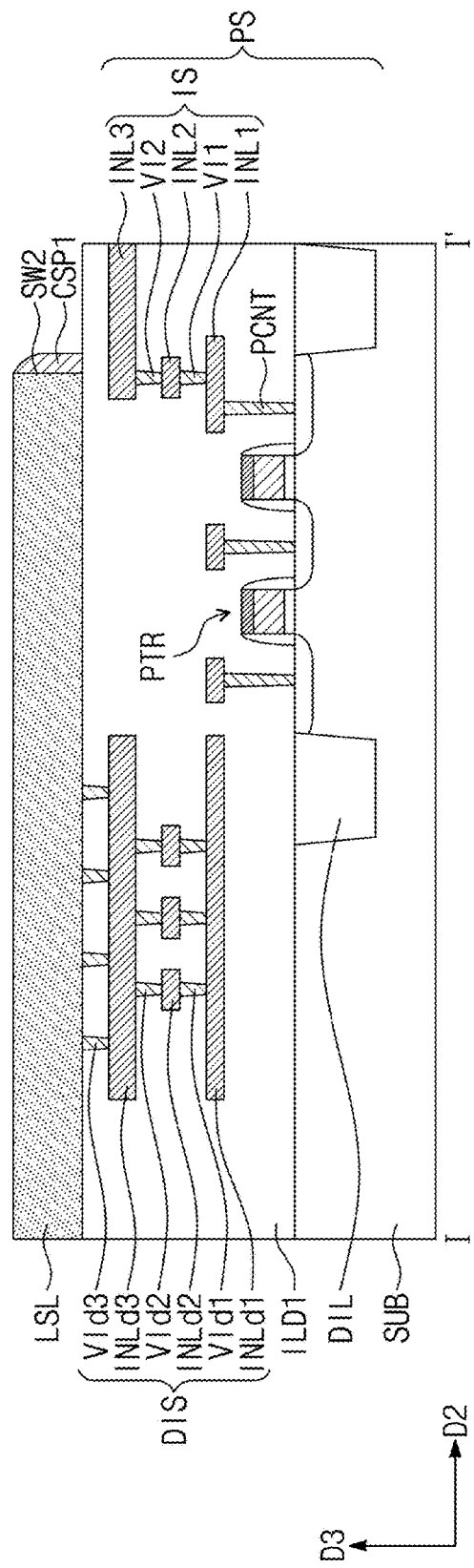
Figure 6B:
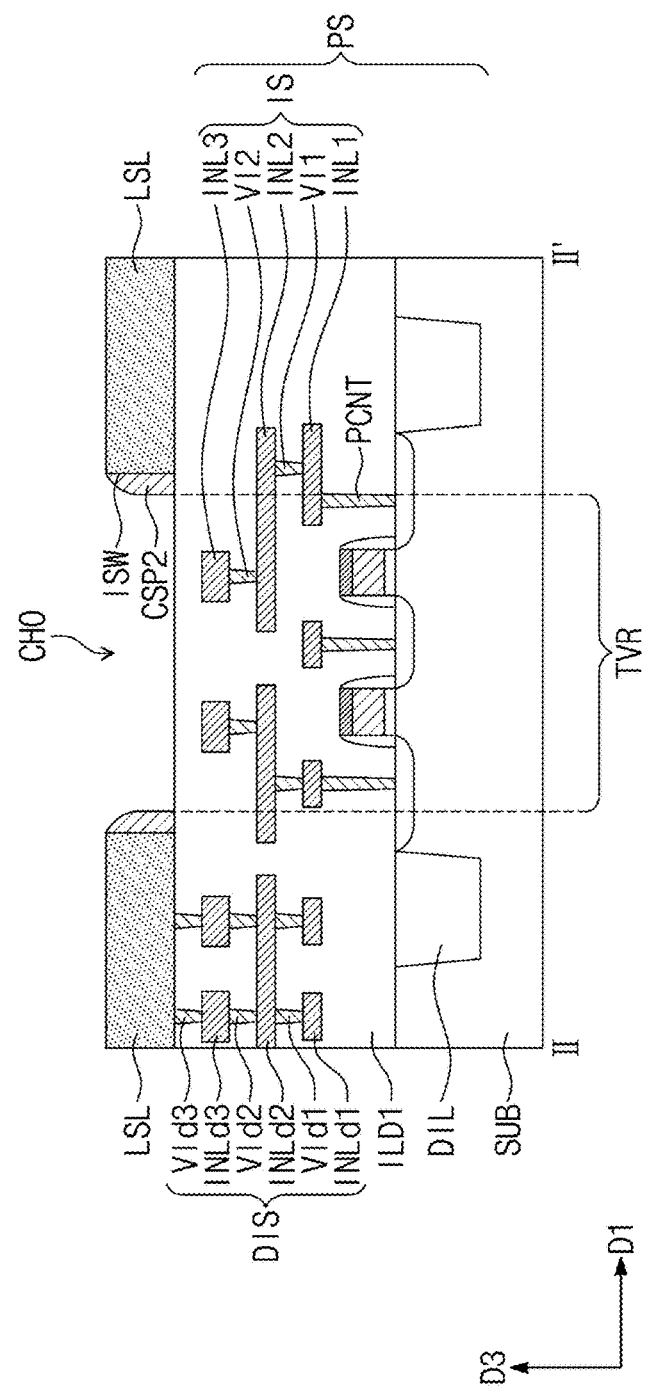

Referring to FIGS. 3, 6A and 6B, the lower semiconductor layer LSL may be patterned to form a plurality of cutting holes CHO penetrating the lower semiconductor layer LSL. The cutting holes CHO may extend in the second direction D2. The cutting holes CHO may be arranged in the first direction D1. A region exposed by the cutting hole CHO may be defined as a through-contact region TVR. The patterning process may further include patterning the lower semiconductor layer LSL in the form of a rectangular plate.

First and second conductive spacers CSP1 and CSP2 may be formed on the lower semiconductor layer LSL. The first conductive spacer CSP1 may be formed on first to fourth sidewalls SW1 to SW4 of the lower semiconductor layer LSL. The second conductive spacer CSP2 may be formed in each of the cutting holes CHO of the lower semiconductor layer LSL. The second conductive spacer CSP2 may cover an inner sidewall ISW of the lower semiconductor layer LSL. For example, the formation of the first and second conductive spacers CSP1 and CSP2 may include conformally forming a conductive layer on the lower semiconductor layer LSL, and anisotropically etching the conductive layer until a top surface of the lower semiconductor layer LSL is exposed. The conductive layer may include a metal such as tungsten, copper, or aluminum.

Figure 7A:
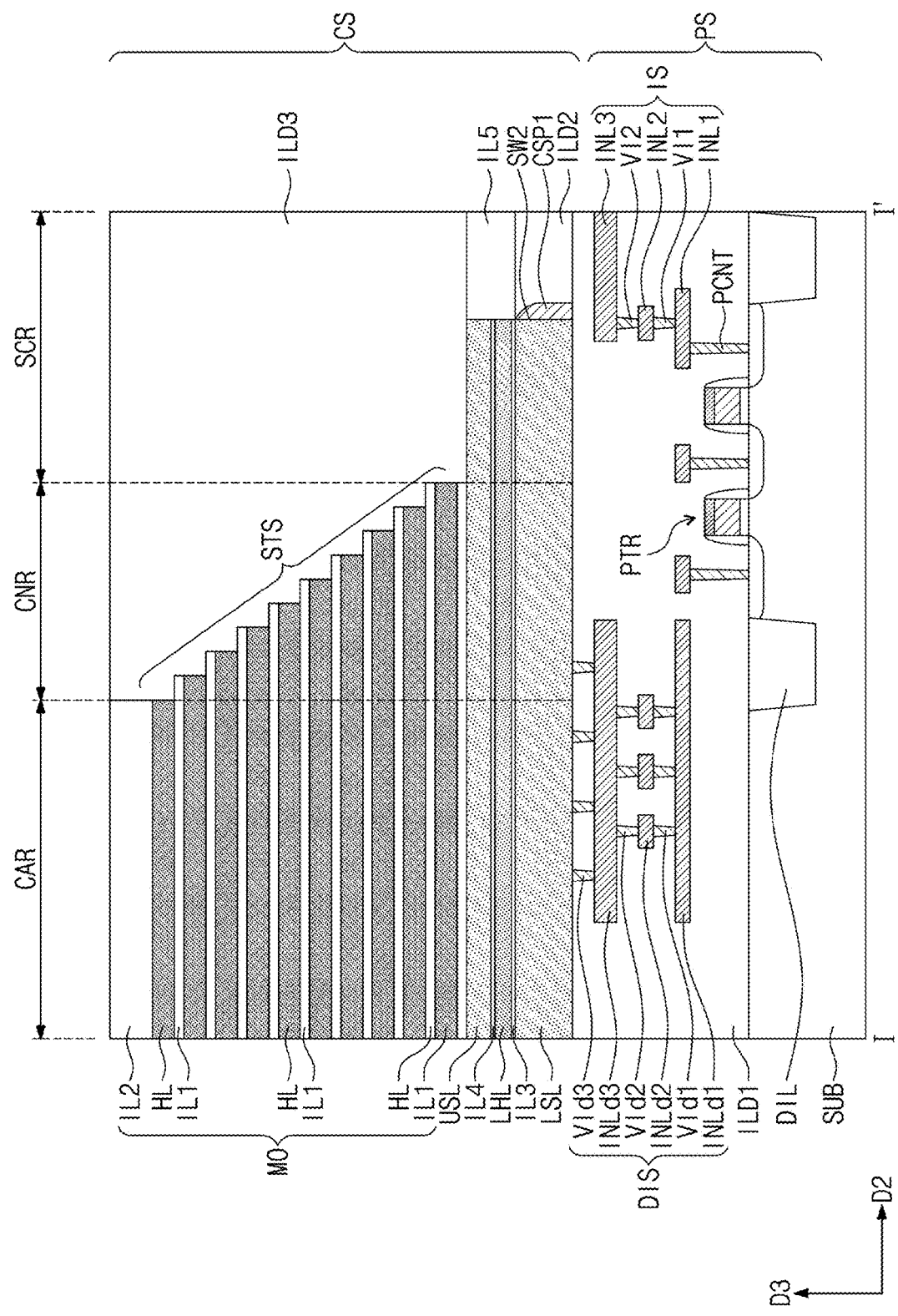
Figure 7B:
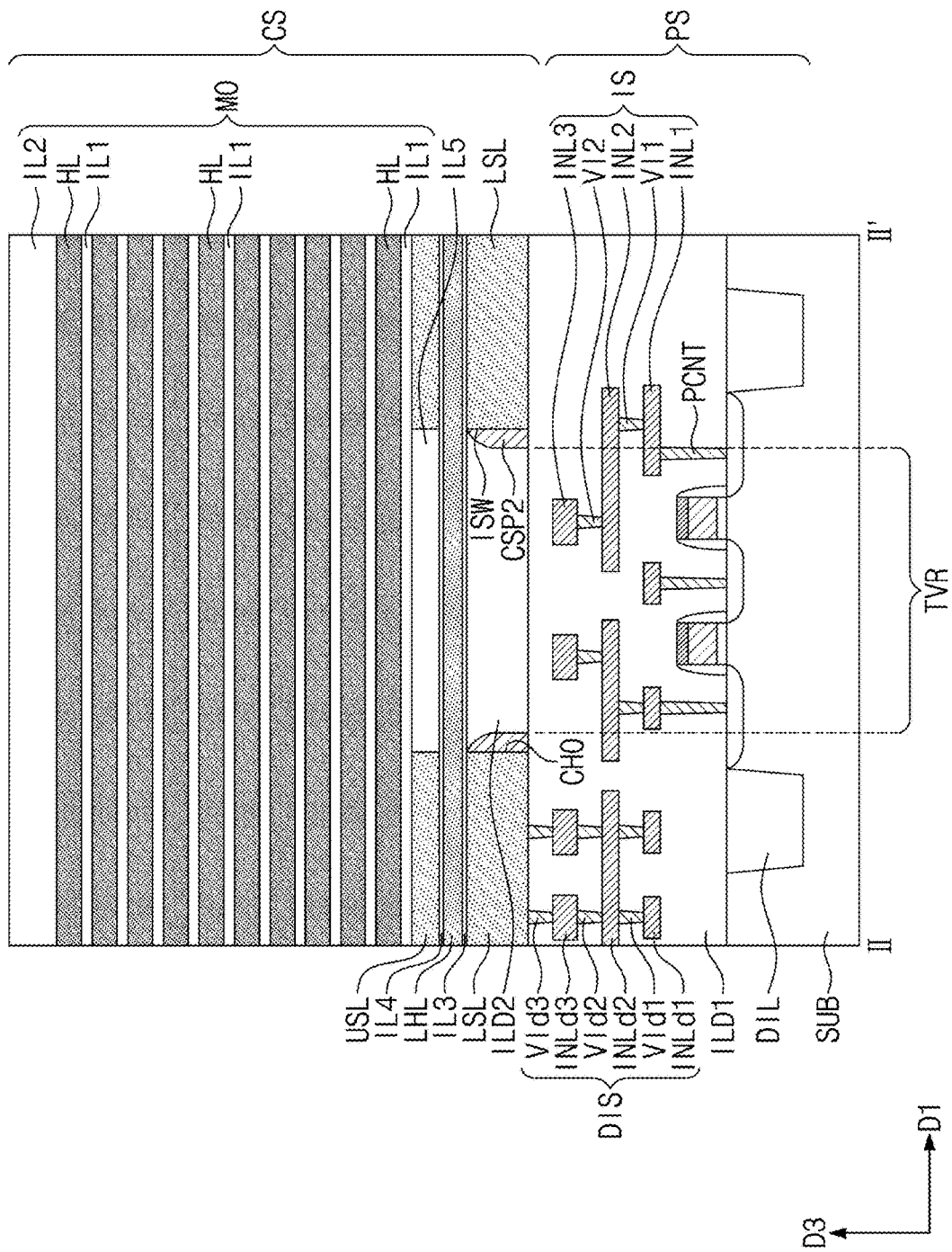

Referring to FIGS. 3, 7A and 7B, a second interlayer insulating layer ILD2 may be formed on the lower semiconductor layer LSL to fill the cutting holes CHO, and the second interlayer insulating layer ILD2 may be planarized to expose the lower semiconductor layer LSL. A third insulating layer IL3, a lower sacrificial layer LHL and/or a fourth insulating layer IL4 which are sequentially stacked on the lower semiconductor layer LSL may be formed. The lower sacrificial layer LHL may be formed to overlap with the lower semiconductor layer LSL when viewed in a plan view. For example, each of the third and fourth insulating layers IL3 and IL4 may include a silicon oxide layer, and the lower sacrificial layer LHL may include a silicon nitride layer or a silicon oxynitride layer.

An upper semiconductor layer USL may be formed on the fourth insulating layer IL4. The upper semiconductor layer USL may be formed to overlap with the lower semiconductor layer LSL. The upper semiconductor layer USL may be patterned to expose the through-contact region TVR. A fifth insulating layer IL5 may be formed to fill the patterned region of the upper semiconductor layer USL, which exposes the through-contact region TVR. In addition, the fifth insulating layer IL5 may also be formed on the second interlayer insulating layer ILD2 of the source connection region SCR. The fifth insulating layer IL5 may include an insulating material such as a silicon oxide layer.

A mold structure MO may be formed on the upper semiconductor layer USL. For example, first insulating layers IL1 and sacrificial layers HL may be alternately stacked on the upper semiconductor layer USL to form the mold structure MO. A second insulating layer IL2 may be formed at the uppermost layer of the mold structure MO.

The first insulating layers ILL the sacrificial layers HL and/or the second insulating layer IL2 may be deposited using a thermal chemical vapor deposition (thermal CVD) process, a plasma-enhanced CVD process, a physical CVD process, and/or an atomic layer deposition (ALD) process. For example, each of the first insulating layers IL1 may include a silicon oxide layer, and each of the sacrificial layers HL may include a silicon nitride layer or a silicon oxynitride layer.

A staircase structure STS may be formed at the mold structure MO on the connection region CNR. For example, a cycle process may be performed on the mold structure MO to form the staircase structure STS on the connection region CNR. The formation of the staircase structure STS may include forming a mask pattern (not shown) on the mold structure MO, and repeatedly performing a cycle using the mask pattern a plurality of times. The cycle may include a process of etching a portion of the mold structure MO by using the mask pattern as an etch mask, and a trimming process of shrinking the mask pattern.

A third interlayer insulating layer ILD3 may be formed on the mold structure MO. The formation of the third interlayer insulating layer ILD3 may include forming a thick insulating layer covering the mold structure MO, and performing a planarization process on the thick insulating layer until the second insulating layer IL2 is exposed.

Figure 8A:
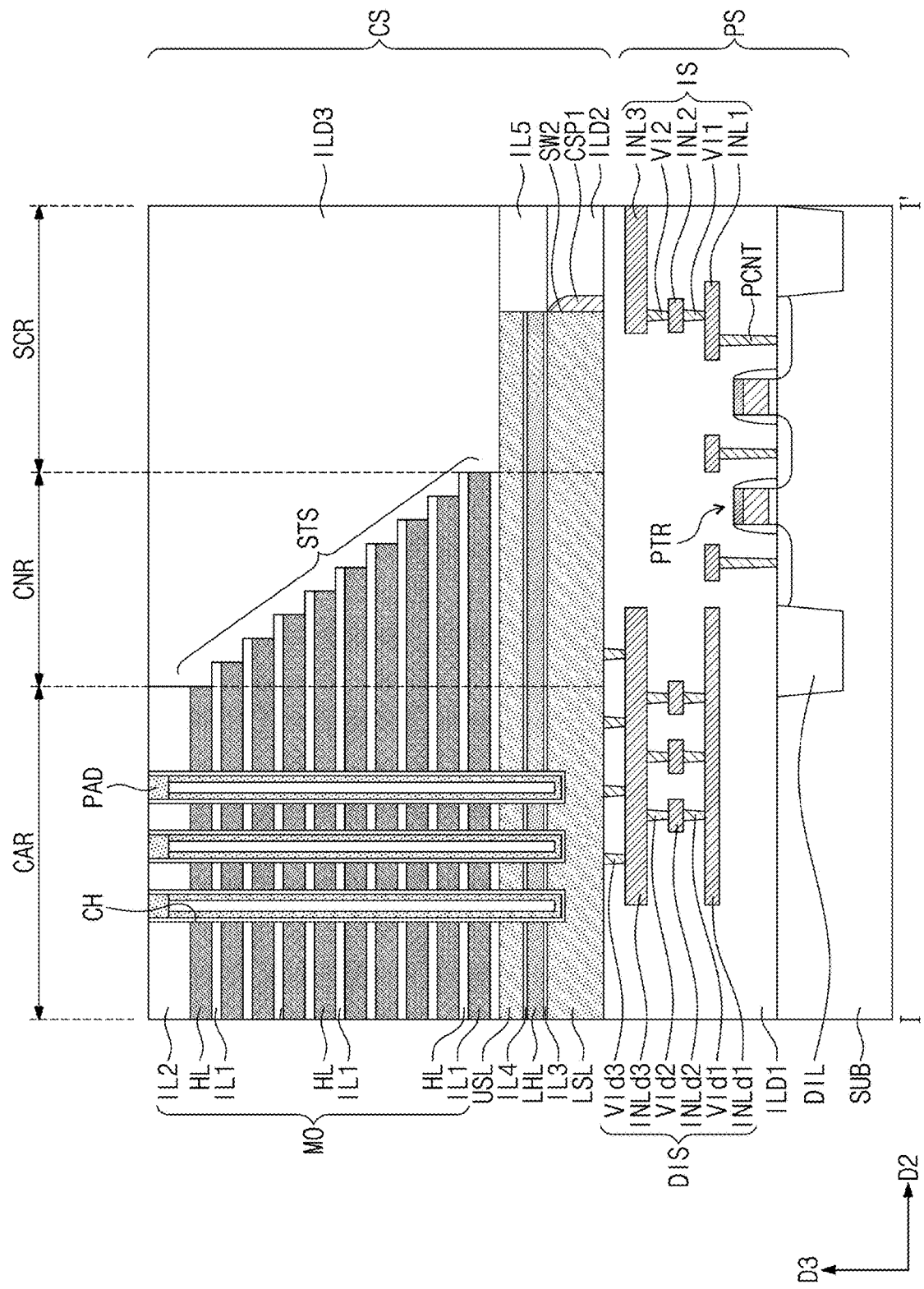
Figure 8B:
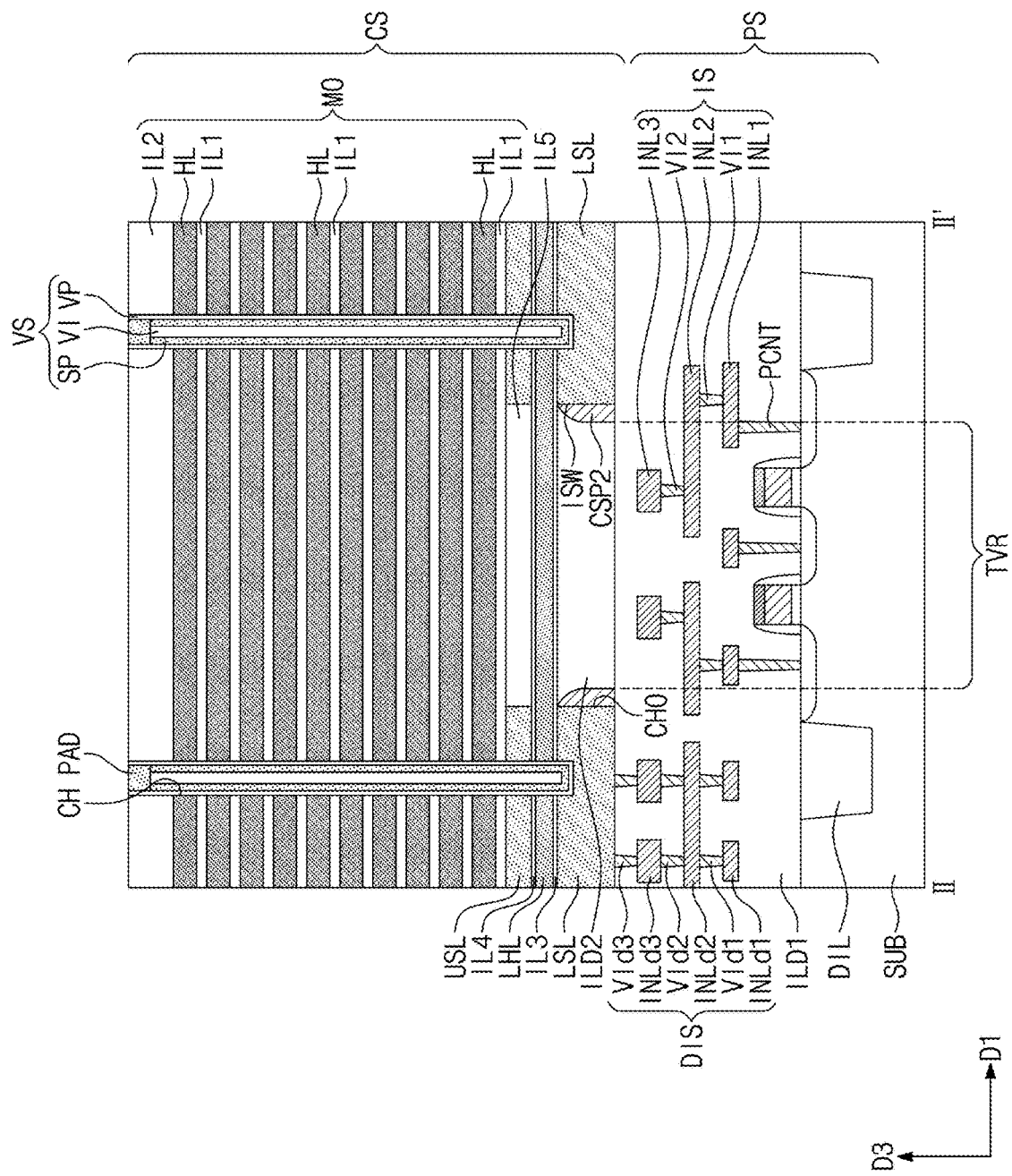

Referring to FIGS. 3, 8A and 8B, channel holes CH penetrating the mold structure MO may be formed on the cell array region CAR. The channel holes CH may expose the lower semiconductor layer LSL. A bottom surface of each of the channel holes CH may be located at a level between the bottom surface and the top surface of the lower semiconductor layer LSL. For example, the formation of the channel holes CH may include forming a mask pattern (not shown) having openings defining the channel holes CH on the mold structure MO, and anisotropically etching the mold structure MO using the mask pattern as an etch mask.

The channel holes CH may be arranged in a line or zigzag form in one direction when viewed in a plan view. The anisotropic etching process for forming the channel holes CH may be a plasma etching process, a reactive ion etching (RIE) process, an inductively coupled plasma reactive ion etching (ICP-RIE) process, or an ion beam etching (IBE) process.

Vertical channel structures VS may be formed in the channel holes CH, respectively. The formation of the vertical channel structure VS may include sequentially forming a vertical insulating layer, a vertical semiconductor layer and a filling insulation layer on an inner surface of the channel hole CH, and performing a planarization process until a top surface of the second insulating layer IL2 is exposed. The vertical insulating layer and the vertical semiconductor layer may be conformally formed.

In more detail, a vertical insulating pattern VP covering the inner surface of the channel hole CH may be formed. The vertical insulating pattern VP may have a pipe shape having an opened top end. The vertical insulating pattern VP may include a data storage layer. A vertical semiconductor pattern SP covering an inner surface of the vertical insulating pattern VP may be formed. The vertical semiconductor pattern SP may have a pipe shape having an opened top end. A filling insulation pattern VI filling the inside of the pipe shape of the vertical semiconductor pattern SP may be formed. The vertical insulating pattern VP, the vertical semiconductor pattern SP and/or the filling insulation pattern VI may constitute the vertical channel structure VS. A conductive pad PAD may be formed on each of the vertical channel structures VS.

Figure 9A:
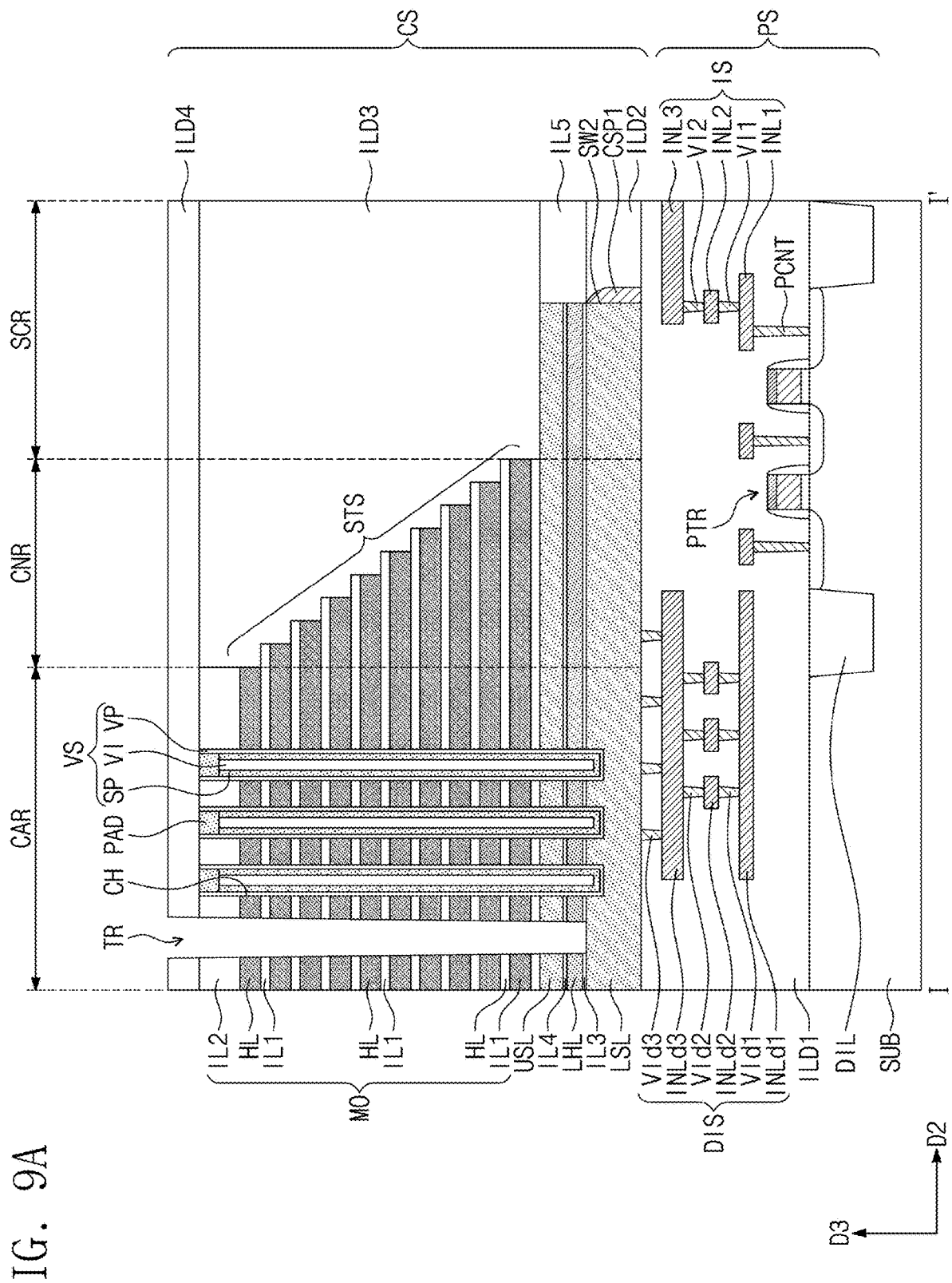
Figure 9B:
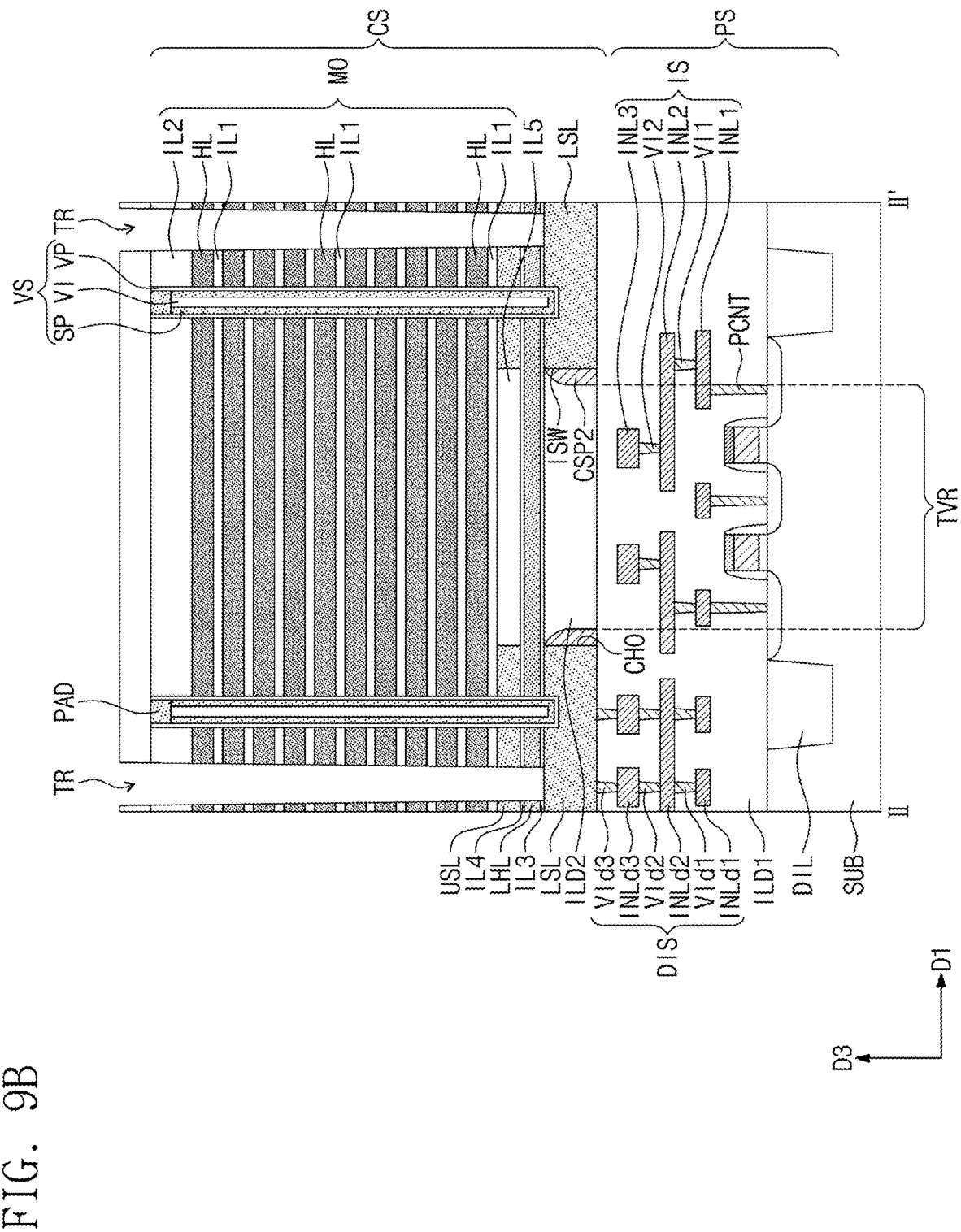

Referring to FIGS. 3, 9A and 9B, a fourth interlayer insulating layer ILD4 may be formed on the mold structure MO and the third interlayer insulating layer ILD3. The fourth interlayer insulating layer ILD4 and the mold structure MO may be patterned to form trenches TR penetrating the fourth interlayer insulating layer ILD4 and the mold structure MO. The trenches TR may extend in the second direction D2 in parallel to each other.

The trench TR may expose the lower semiconductor layer LSL. The trench TR may expose sidewalls of the sacrificial layers HL. The trench TR may expose a sidewall of the third insulating layer IL3, a sidewall of the lower sacrificial layer LHL, and a sidewall of the fourth insulating layer IL4.

Figure 10A:
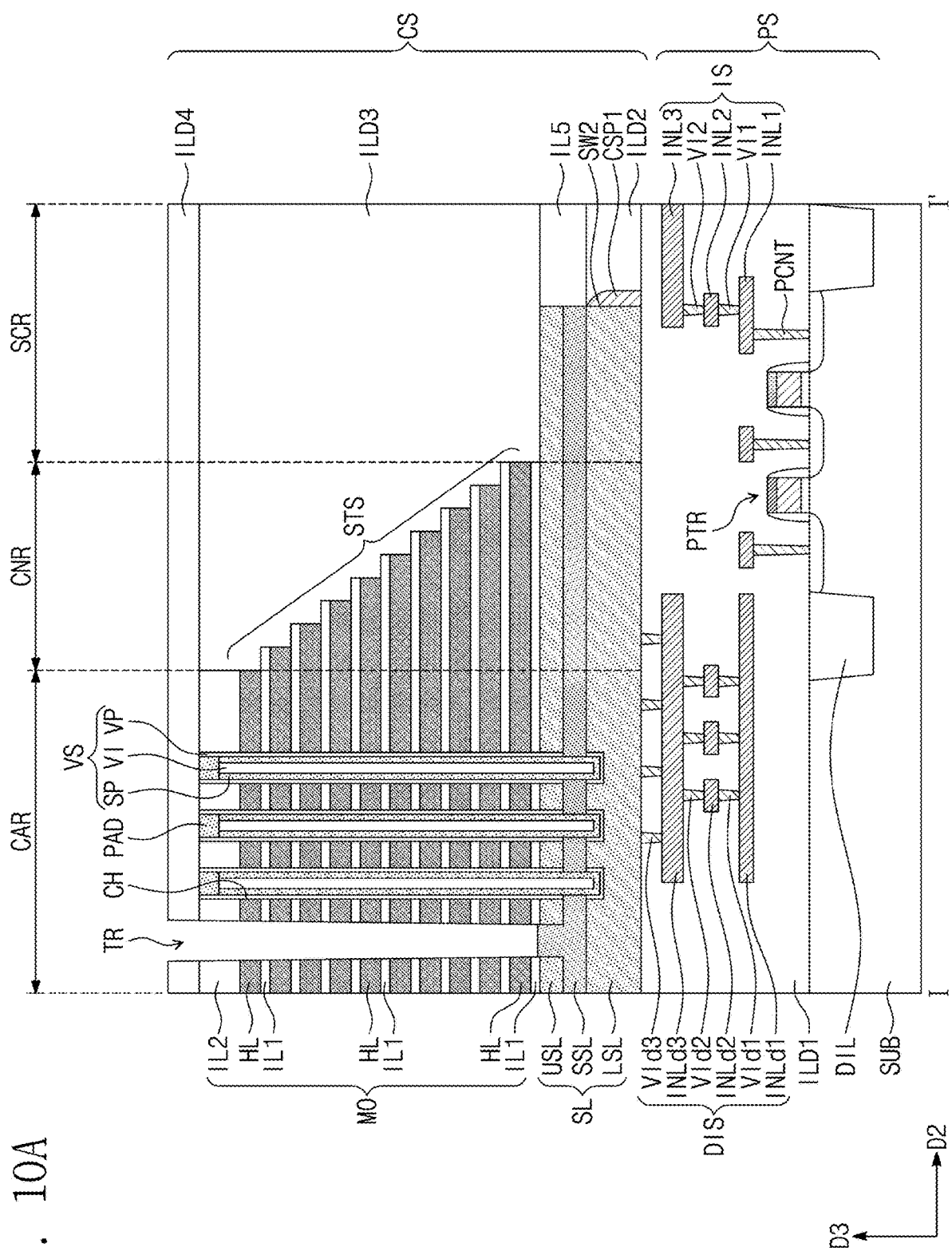
Figure 10B:
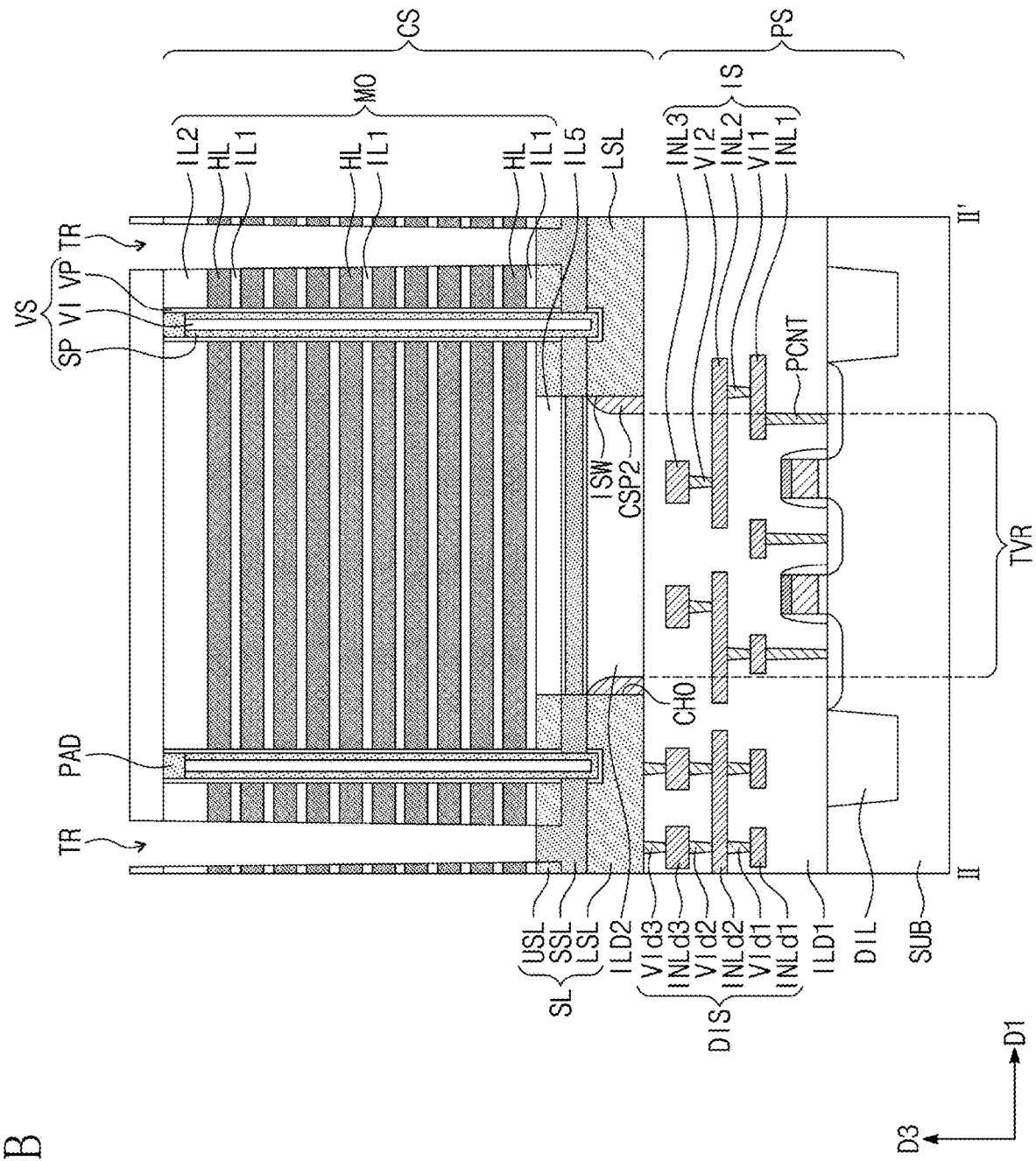

Referring to FIGS. 3, 10A and 10B, the lower sacrificial layer LHL exposed by the trenches TR may be replaced with a source semiconductor layer SSL. In detail, the lower sacrificial layer LHL exposed by the trenches TR may be selectively removed. A lower portion of the vertical insulating pattern VP of each of the vertical channel structures VS may be exposed by the removal of the lower sacrificial layer LHL. At this time, the lower sacrificial layer LHL on the through-contact region TVR may not be removed.

The exposed lower portion of the vertical insulating pattern VP may be selectively removed. Thus, a lower portion of the vertical semiconductor pattern SP may be exposed. The third insulating layer IL3 and the fourth insulating layer IL4 may be removed together during the removal of the lower portion of the vertical insulating pattern VP.

The source semiconductor layer SSL may be formed in a space formed by the removal of the third insulating layer IL3, the lower sacrificial layer LHL and the fourth insulating layer IL4. The source semiconductor layer SSL may be in direct contact with the exposed lower portion of the vertical semiconductor pattern SP. The source semiconductor layer SSL may be in direct contact with the lower semiconductor layer LSL thereunder. The source semiconductor layer SSL may be in direct contact with the upper semiconductor layer USL thereon. The lower semiconductor layer LSL, the source semiconductor layer SSL and the upper semiconductor layer USL may constitute a second substrate SL.

Figure 11A:
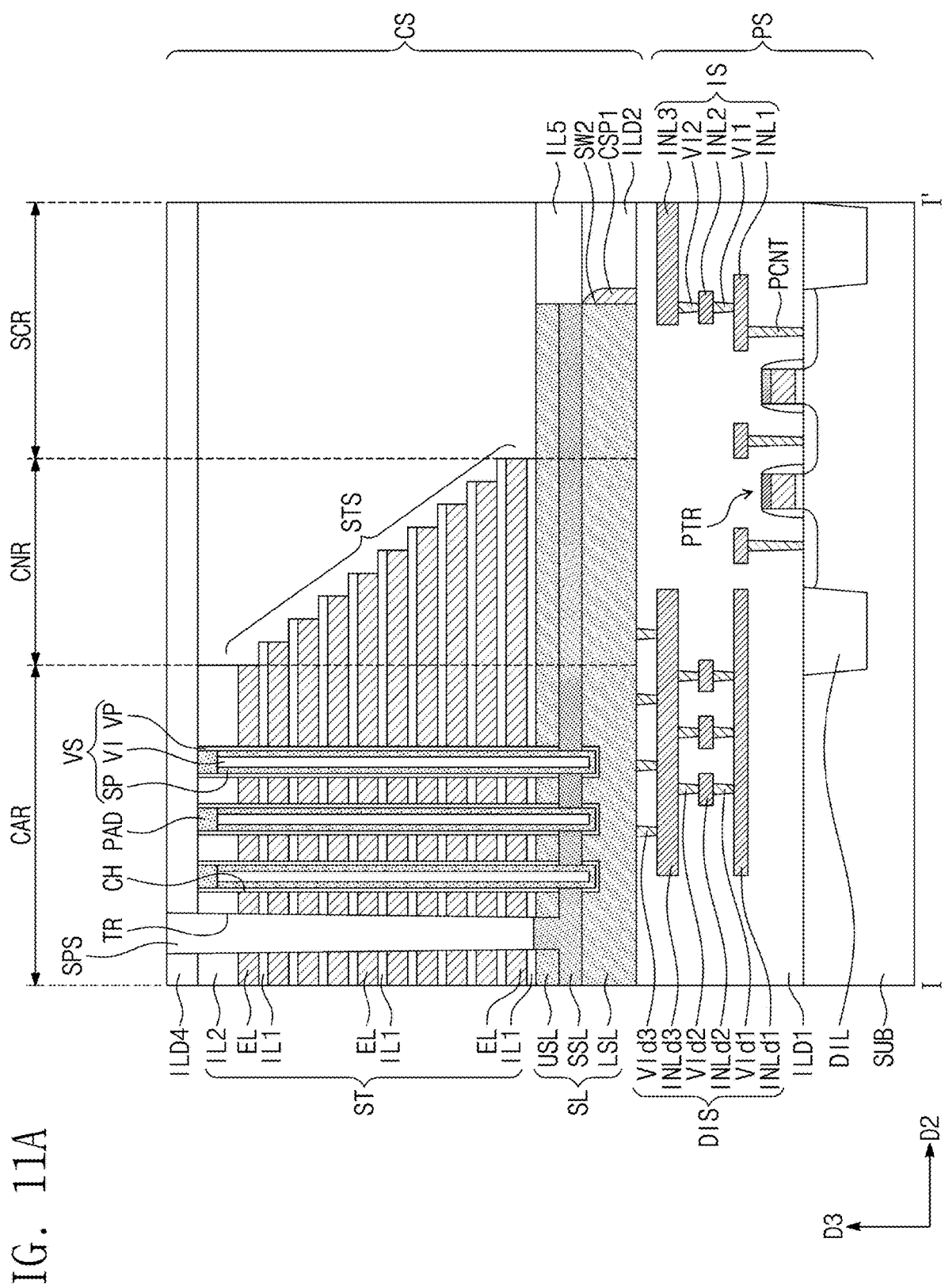
Figure 11B:
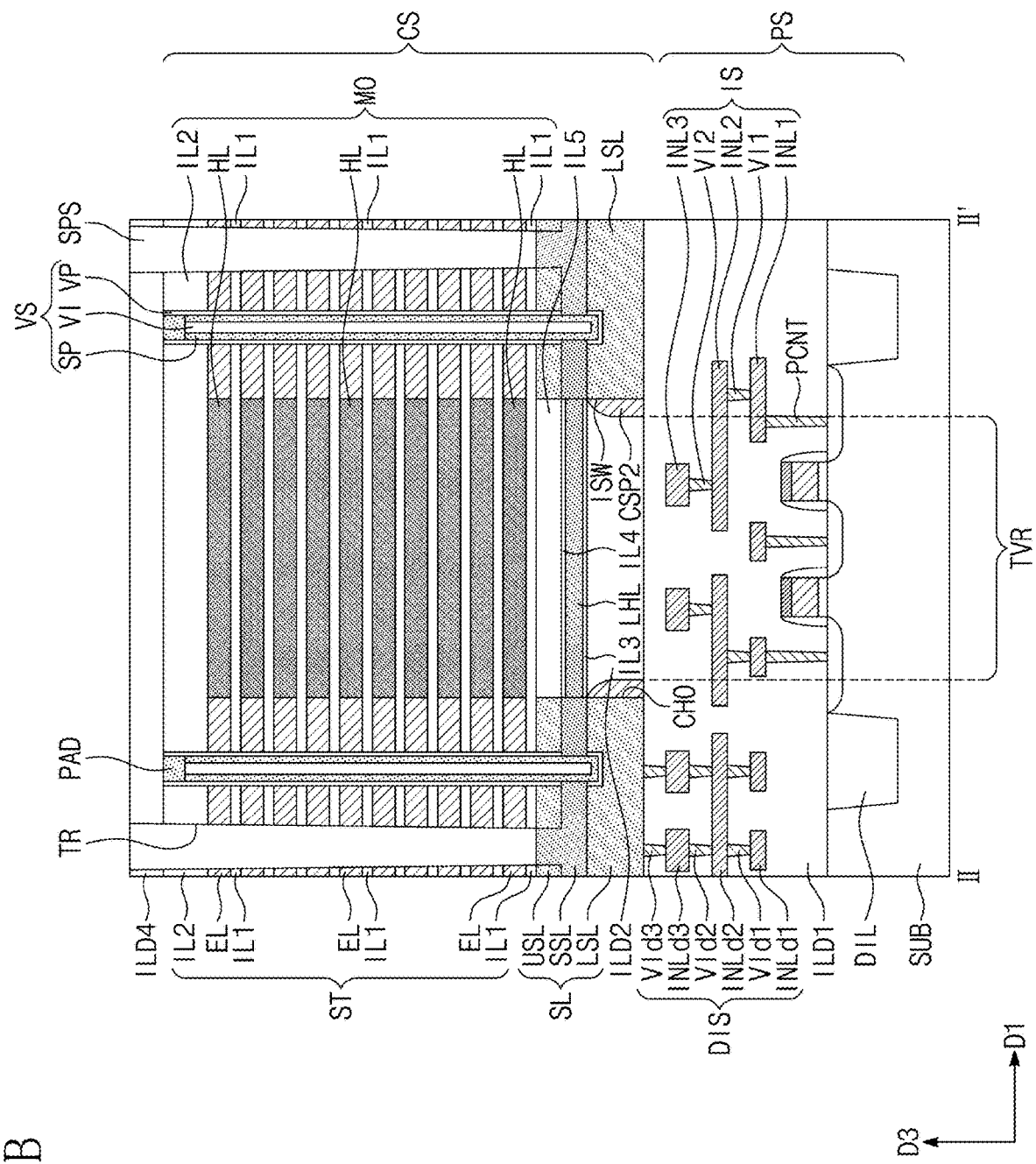

Referring to FIGS. 3, 11A and 11B, the sacrificial layers HL exposed by the trenches TR may be replaced with electrodes EL, respectively, and thus an electrode structure ST may be formed. In detail, the sacrificial layers HL exposed through the trenches TR may be selectively removed. The electrodes EL may be formed in spaces formed by the removal of the sacrificial layers HL, respectively. The sacrificial layers HL on the through-contact region TVR may not be removed. Thus, the mold structure MO on the through-contact region TVR may remain.

Referring again to FIGS. 3, 4A and 4B, through-contacts TVS may be formed on the through-contact region TVR and the source connection region SCR. The through-contacts TVS may extend from the fourth interlayer insulating layer ILD4 to the peripheral circuit structure PS. The formation of the through-contact TVS may include performing an anisotropic etching process on the fourth interlayer insulating layer ILD4 to form a through-hole exposing the third interconnection line INL3 of the peripheral circuit structure PS, and filling the through-hole with a conductive material.

Bit line contact plugs BPLG may be formed to penetrate the fourth interlayer insulating layer ILD4. The bit line contact plugs BPLG may be connected to the conductive pads PAD, respectively. Cell contact plugs PLG may be formed to penetrate the third and fourth interlayer insulating layers ILD3 and ILD4. The cell contact plugs PLG may be connected to the electrodes EL, respectively. Bit lines BL and upper interconnection lines UIL may be formed on the fourth interlayer insulating layer ILD4. The bit lines BL may be electrically connected to the bit line contact plugs BPLG, and the upper interconnection lines UIL may be electrically connected to the cell contact plugs PLG.

Figure 12:
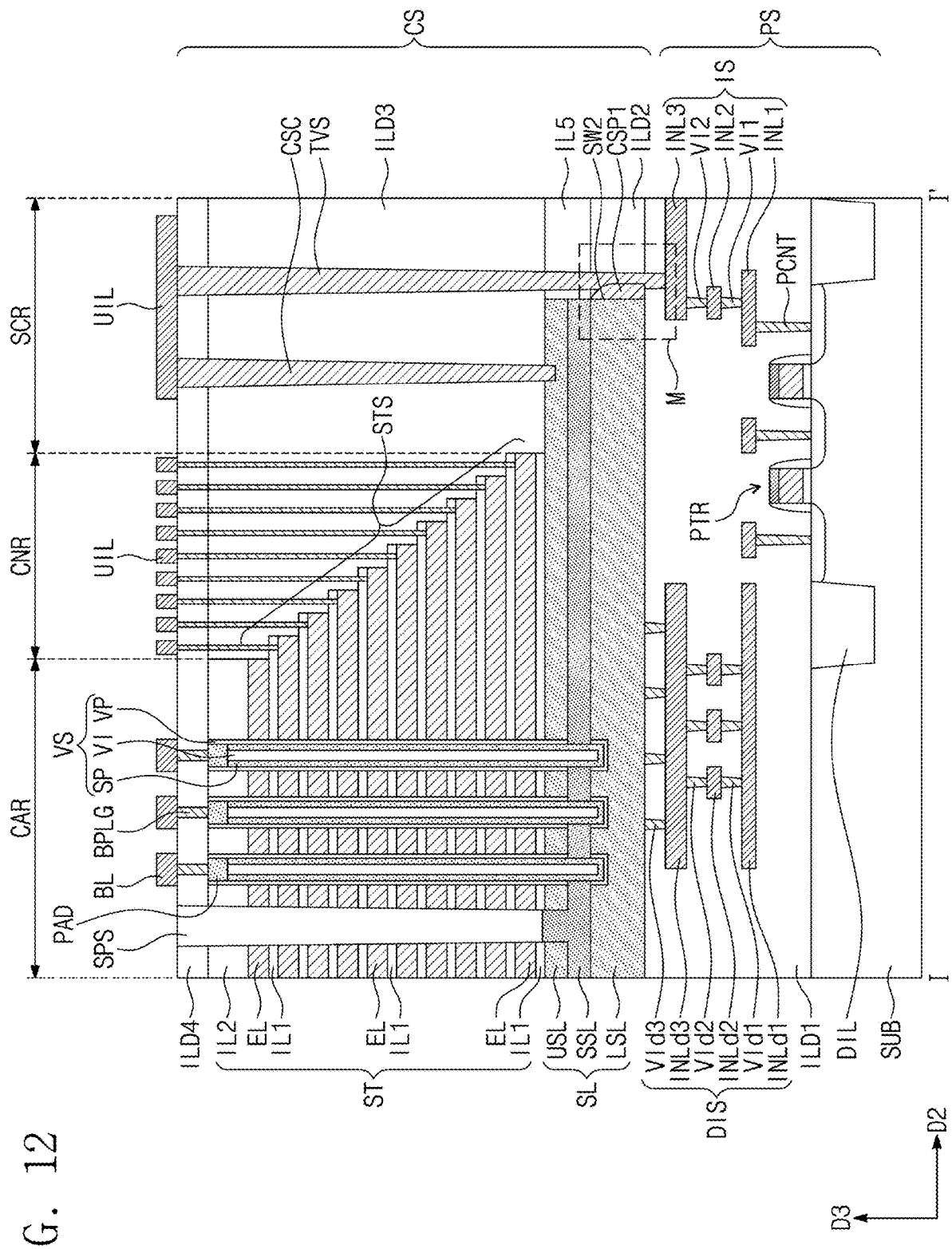
FIG. 12 is a cross-sectional view taken along the line I-I' of FIG. 3 to illustrate a 3D semiconductor memory device according to some example embodiments of the inventive concepts.
Figure 13:
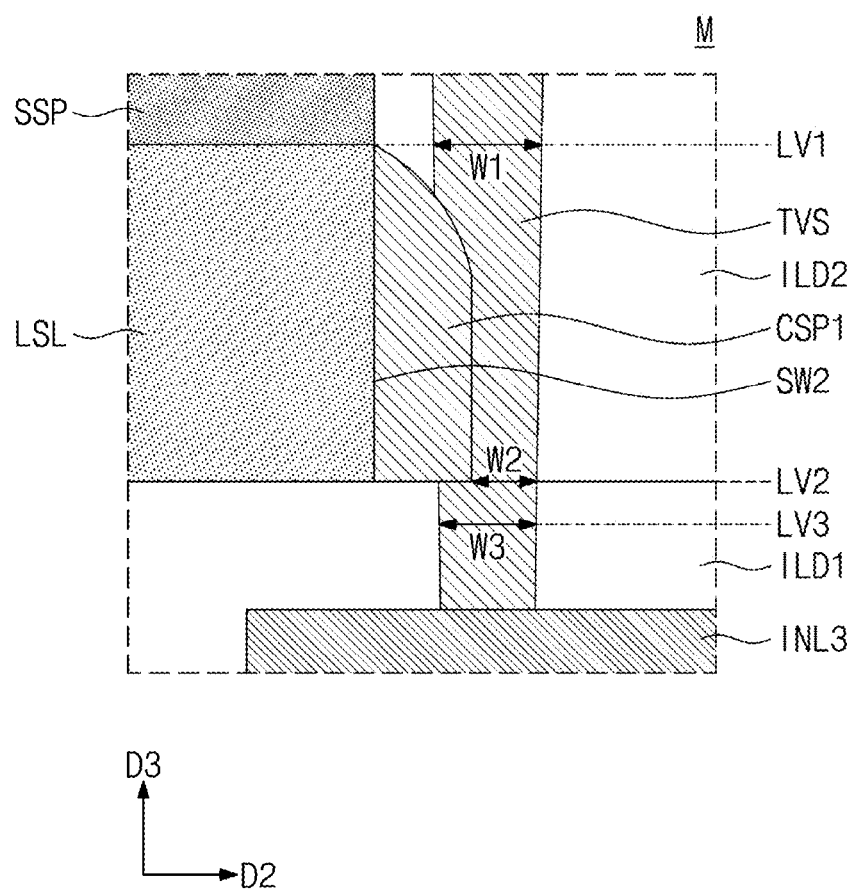
FIGS. 13 and 14 are enlarged cross-sectional views of a region 'M' of FIG. 12.
Figure 14:
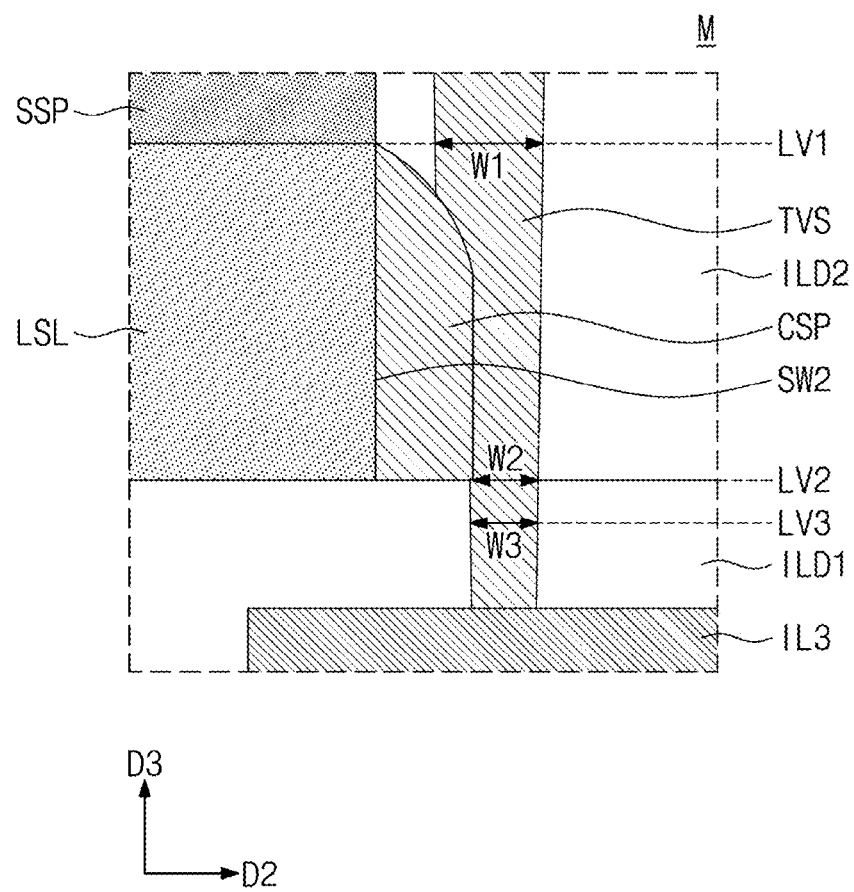

FIG. 12 is a cross-sectional view taken along the line I-I' of FIG. 3 to illustrate a 3D semiconductor memory device according to some example embodiments of the inventive concepts. FIGS. 13 and 14 are enlarged cross-sectional views of a region 'M' of FIG. 12. In the present example embodiments, the descriptions to the same components and technical features as in the example embodiments of FIGS. 3, 4A and 4B will be omitted for the purpose of ease and convenience in explanation. In other words, differences between the present example embodiments and the example embodiments of FIGS. 3, 4A and 4B will be mainly described hereinafter.

Referring to FIGS. 3 and 12, a through-contact TVS of the source connection region SCR may be in contact with the first conductive spacer CSP1. Thus, the common source voltage may be applied directly to the lower semiconductor layer LSL from the through-contact TVS through the first conductive spacer CSP1. The first conductive spacer CSP1 and the through-contact TVS may correspond to a metal member attached to the second substrate SL, and thus a resistance of the second substrate SL may be reduced.

Referring to FIG. 13, the through-contact TVS may have a first width W1 at a first level LV1 of the top surface of the lower semiconductor layer LSL. The through-contact TVS may have a second width W2 at a second level LV2 of the bottom surface of the lower semiconductor layer LSL. The through-contact TVS may have a third width W3 at a third level LV3 between the lower semiconductor layer LSL and the third interconnection line INL3. The first width W1 may be greater than the third width W3. The third width W3 may be greater than the second width W2. Formation of the through-contact TVS according to the present example embodiments may include forming a through-hole by an anisotropic etching process, and performing a wet etching process in the through-hole to expand the through-hole.

In some example embodiments, referring to FIG. 14, the third width W3 may be equal to or greater than the second width W2 and may be less than 150% of the second width W2. The first width W1 may be greater than 150% of the third width W3. The wet etching process described with reference to FIG. 13 may be omitted in a process of forming the through-contact TVS according to the present example embodiments.

Figure 15:
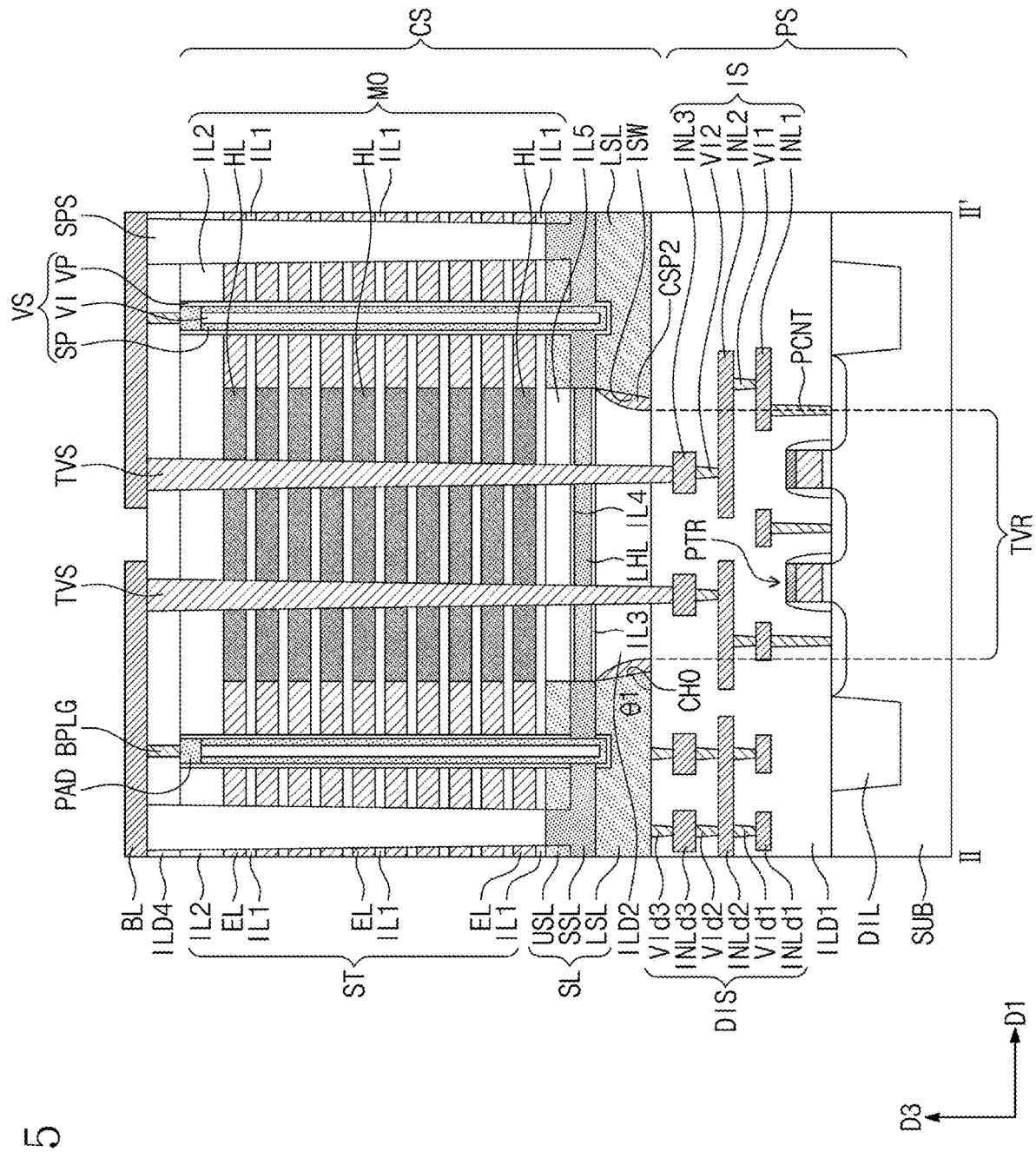
FIGS. 15, 16 and 17 are cross-sectional views taken along the line II-II' of FIG. 3 to illustrate 3D semiconductor memory devices according to some example embodiments of the inventive concepts.
Figure 16:
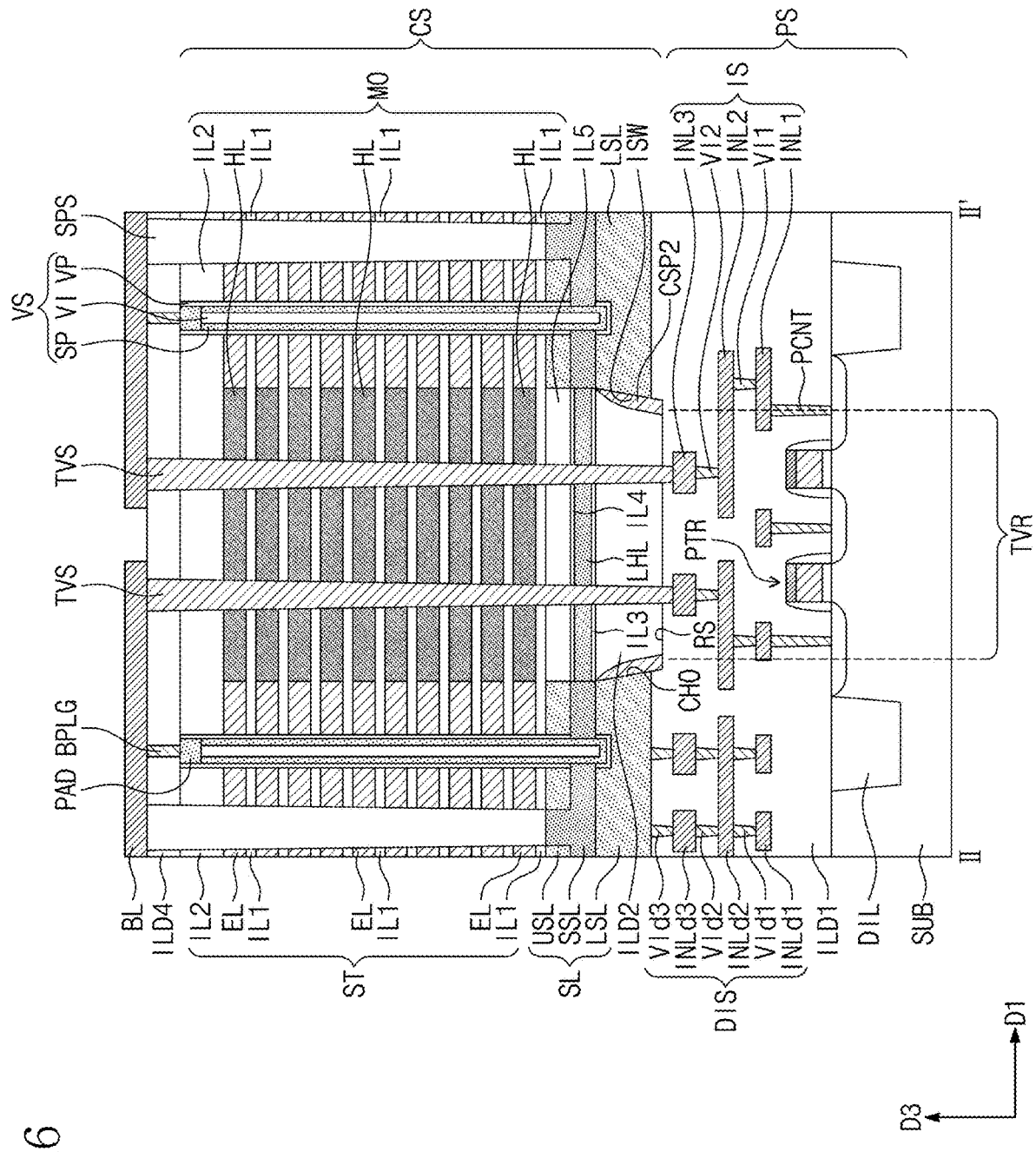
Figure 17:
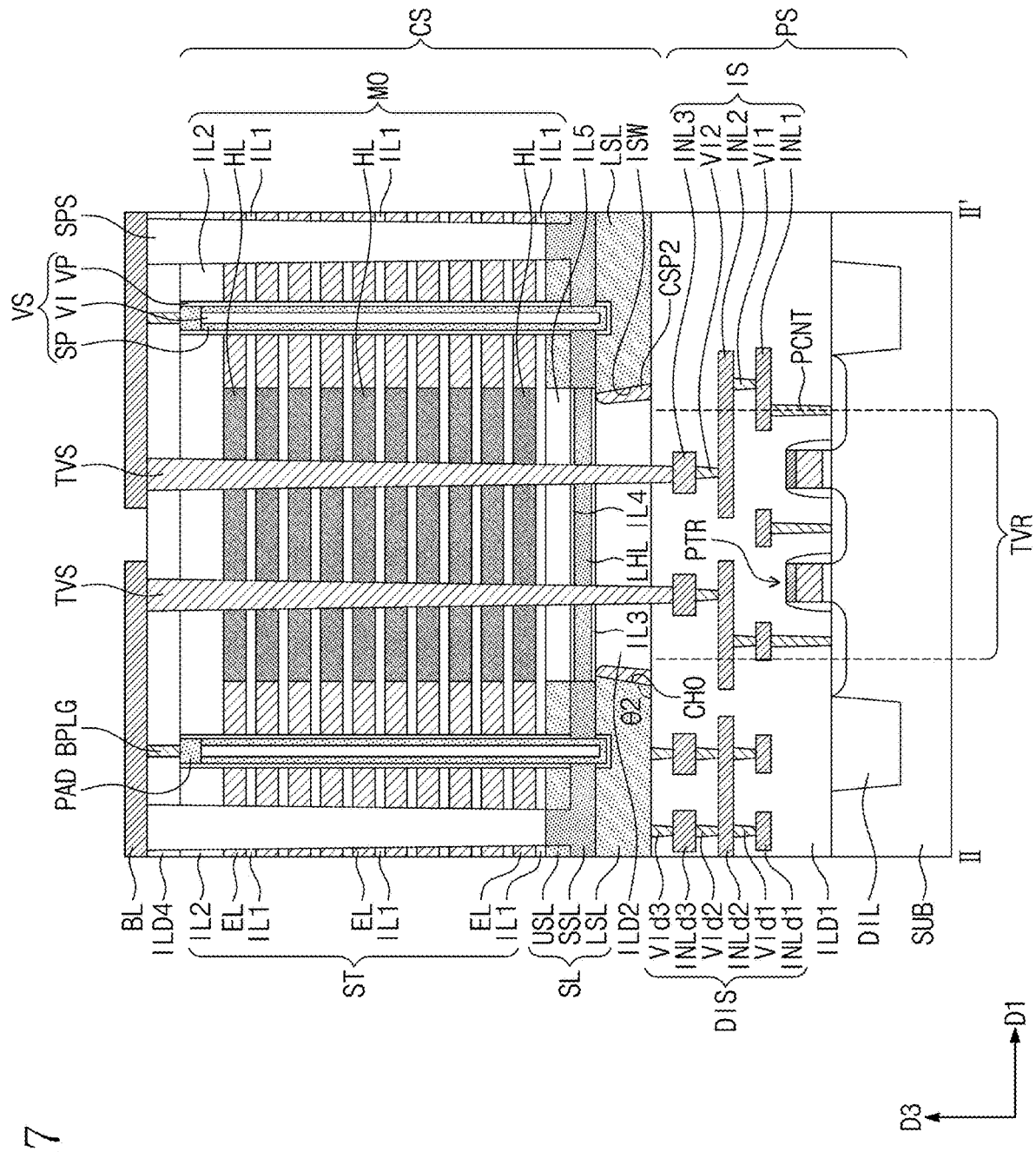

FIGS. 15, 16 and 17 are cross-sectional views taken along the line II-II' of FIG. 3 to illustrate 3D semiconductor memory devices according to some example embodiments of the inventive concepts. In the present example embodiments, the descriptions to the same components and technical features as in the example embodiments of FIGS. 3, 4A and 4B will be omitted for the purpose of ease and convenience in explanation. In other words, differences between the present example embodiments and the example embodiments of FIGS. 3, 4A and 4B will be mainly described hereinafter.

In some example embodiments, referring to FIGS. 3 and 15, the inner sidewall ISW of the lower semiconductor layer LSL which defines the cutting hole CHO may be inclined. For example, a first angle $\theta1$ between the inner sidewall ISW and the top surface of the first interlayer insulating layer ILD1 may range from 70 degrees to 89 degrees. The second conductive spacer CSP2 may cover the inclined inner sidewall ISW.

In some example embodiments, referring to FIGS. 3 and 16, the cutting hole CHO may be more recessed toward the first substrate SUB, and thus a recess region RS may be formed in the first interlayer insulating layer ILD1. A bottom surface of the recess region RS may be lower than the bottom surface of the lower semiconductor layer LSL. The second conductive spacer CSP2 may partially fill the recess region RS. A bottom surface of the second conductive spacer CSP2 may be lower than the bottom surface of the lower semiconductor layer LSL. A volume of the second conductive spacer CSP2 may be relatively increased through the recess region RS. Thus, the resistance of the second substrate SL may be further reduced.

In some example embodiments, referring to FIGS. 3 and 17, a second angle $\theta2$ between the inner sidewall ISW and the top surface of the first interlayer insulating layer ILD1 may range from 91 degrees to 120 degrees. The second conductive spacer CSP2 may cover the inclined inner sidewall ISW. Since the inner sidewall ISW is inclined, a width of the second conductive spacer CSP2 in the first direction D1 may become progressively greater toward the first substrate SUB. A volume of the second conductive spacer CSP2 formed on the inner sidewall ISW may be relatively increased since the inner sidewall ISW is inclined. Thus, the resistance of the second substrate SL may be further reduced.

Figure 18:
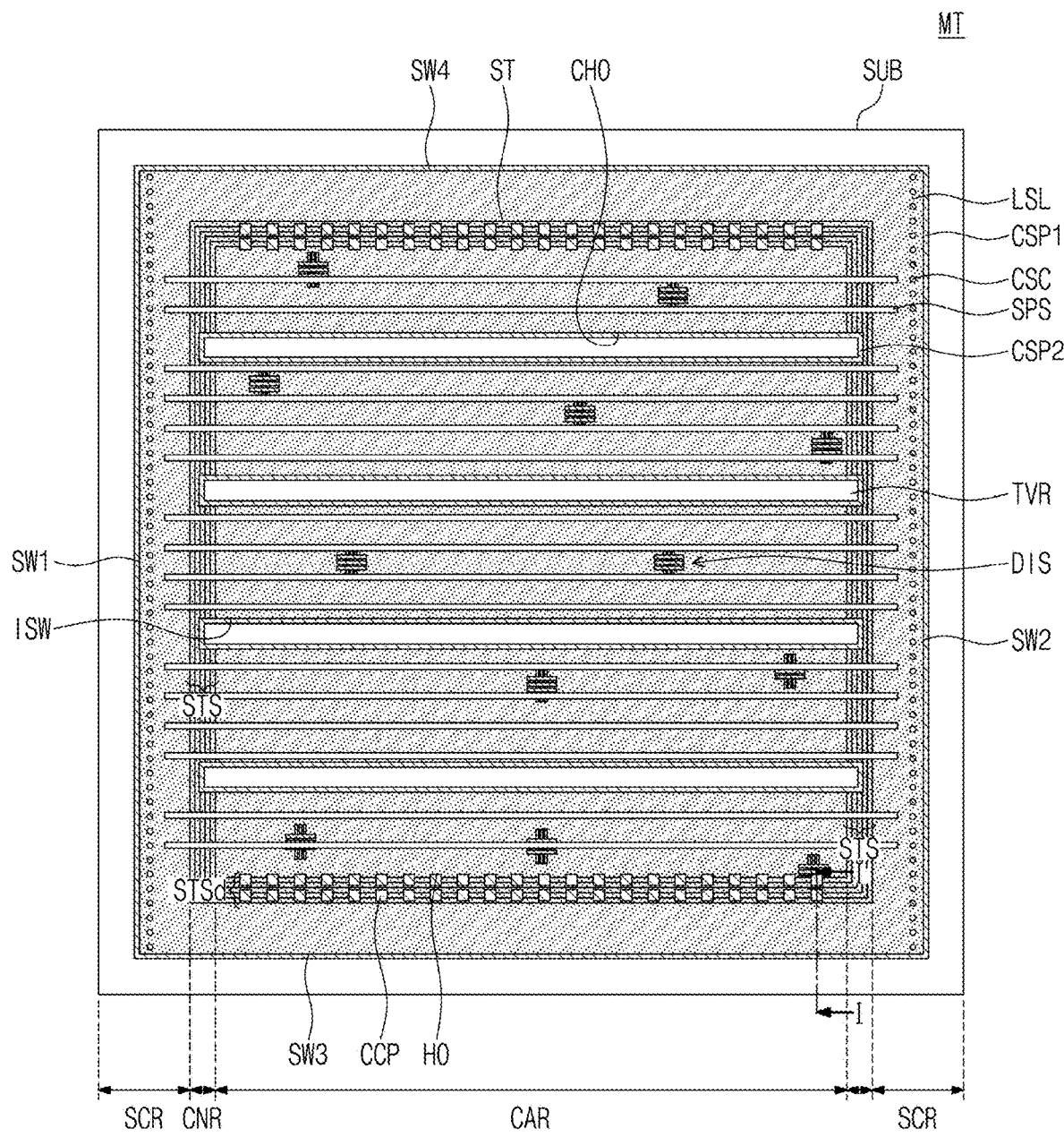
FIG. 18 is a plan view illustrating a 3D semiconductor memory device according to some example embodiments of the inventive concepts.
Figure 19:
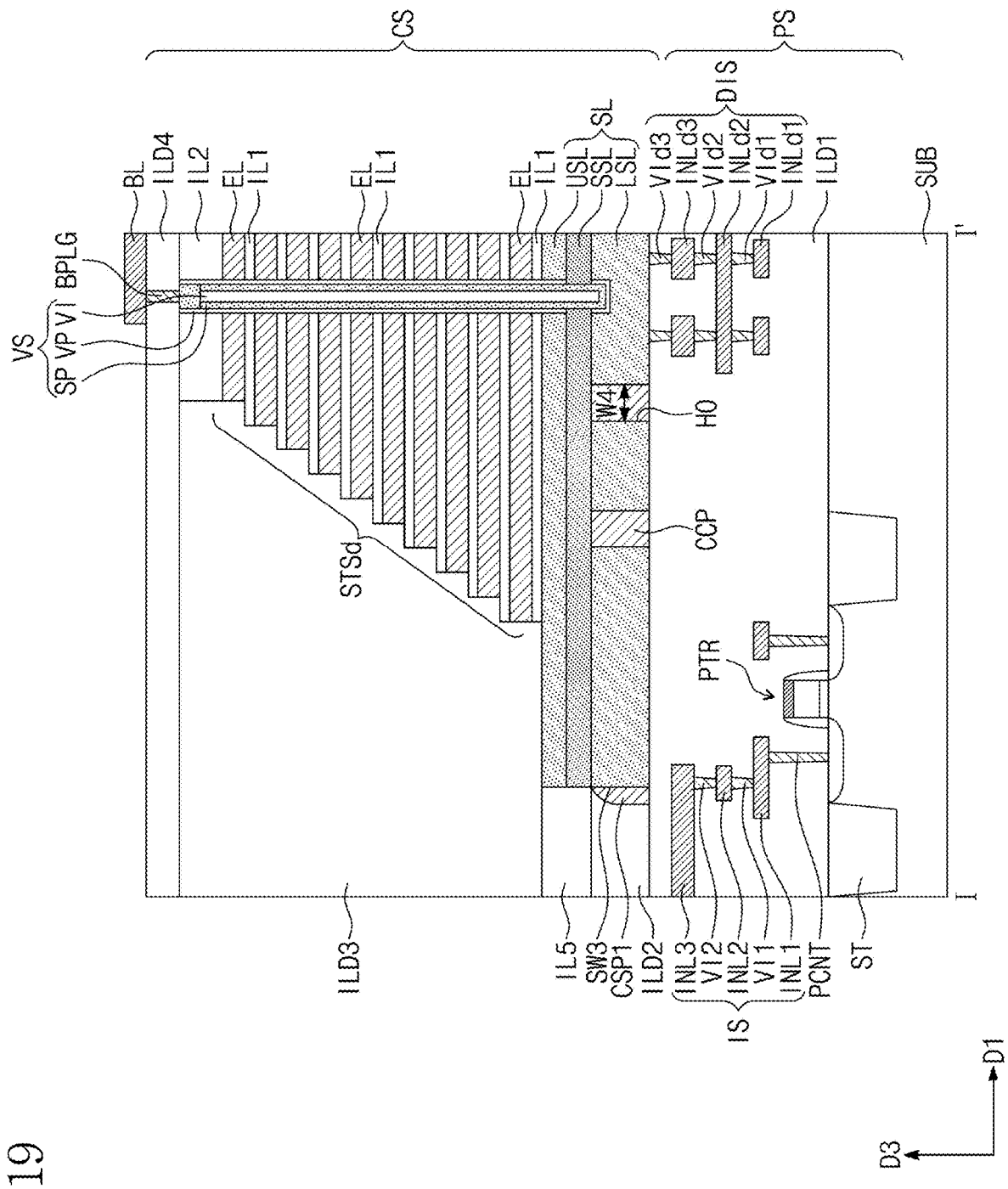
FIG. 19 is a cross-sectional view taken along a line I-I' of FIG. 18.

FIG. 18 is a plan view illustrating a 3D semiconductor memory device according to some example embodiments of the inventive concepts. FIG. 19 is a cross-sectional view taken along a line I-I' of FIG. 18. In the present example embodiments, the descriptions to the same components and technical features as in the example embodiments of FIGS. 3, 4A and 4B will be omitted for the purpose of ease and convenience in explanation. In other words, differences between the present example embodiments and the example embodiments of FIGS. 3, 4A and 4B will be mainly described hereinafter.

Referring to FIGS. 18 and 19, the electrode structure ST may include a dummy staircase structure STSd. The dummy staircase structure STSd may be adjacent to the third or fourth sidewall SW3 or SW4. The dummy staircase structure STSd may extend in the second direction D2. The cell contact plugs PLG described above may not be provided on the dummy staircase structure STSd.

Conductive patterns CCP may be provided in the lower semiconductor layer LSL under the dummy staircase structure STSd. For example, the lower semiconductor layer LSL may include a plurality of holes HO formed under the dummy staircase structure STSd. The holes HO may be arranged in the second direction D2. A fourth width of the hole HO in the first direction D1 may be greater than a maximum width of the first conductive spacer CSP1 and may be less than twice the maximum width. The conductive pattern CCP may be provided in each of the holes HO. A top surface of the conductive pattern CCP may be substantially coplanar with the top surface of the lower semiconductor layer LSL. The conductive pattern CCP may include a metal such as tungsten, copper, or aluminum.

Since the conductive patterns CCP are provided in the lower semiconductor layer LSL, the amount of a metal member attached to the second substrate SL may be further increased. As a result, the conductive patterns CCP may reduce the resistance of the second substrate SL.

Figure 20:
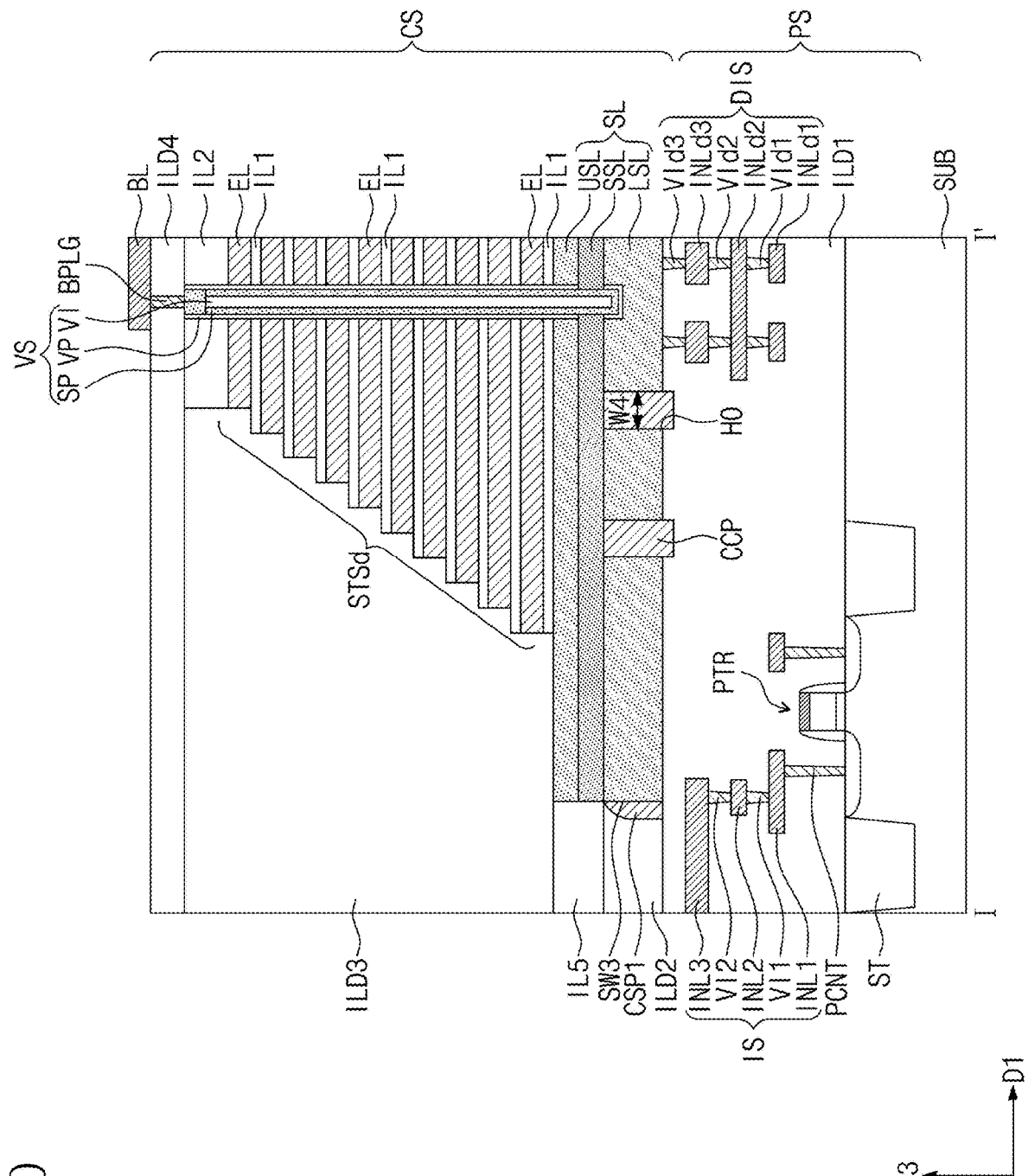
FIG. 20 is a cross-sectional view taken along the line I-I' of FIG. 18 to illustrate a 3D semiconductor memory device according to some example embodiments of the inventive concepts.

FIG. 20 is a cross-sectional view taken along the line I-I' of FIG. 18 to illustrate a 3D semiconductor memory device according to some example embodiments of the inventive concepts. Referring to FIG. 20, the hole HO may be more recessed toward the first substrate SUB, and thus a bottom surface of the hole HO may be located at a lower level than the bottom surface of the lower semiconductor layer LSL. Thus, a bottom surface of the conductive pattern CCP may be lower than the bottom surface of the lower semiconductor layer LSL. A volume of the conductive pattern CCP illustrated in FIG. 20 may be greater than a volume of the conductive pattern CCP illustrated in FIG. 19, and thus the resistance of the second substrate SL may be further reduced.

Figure 21:
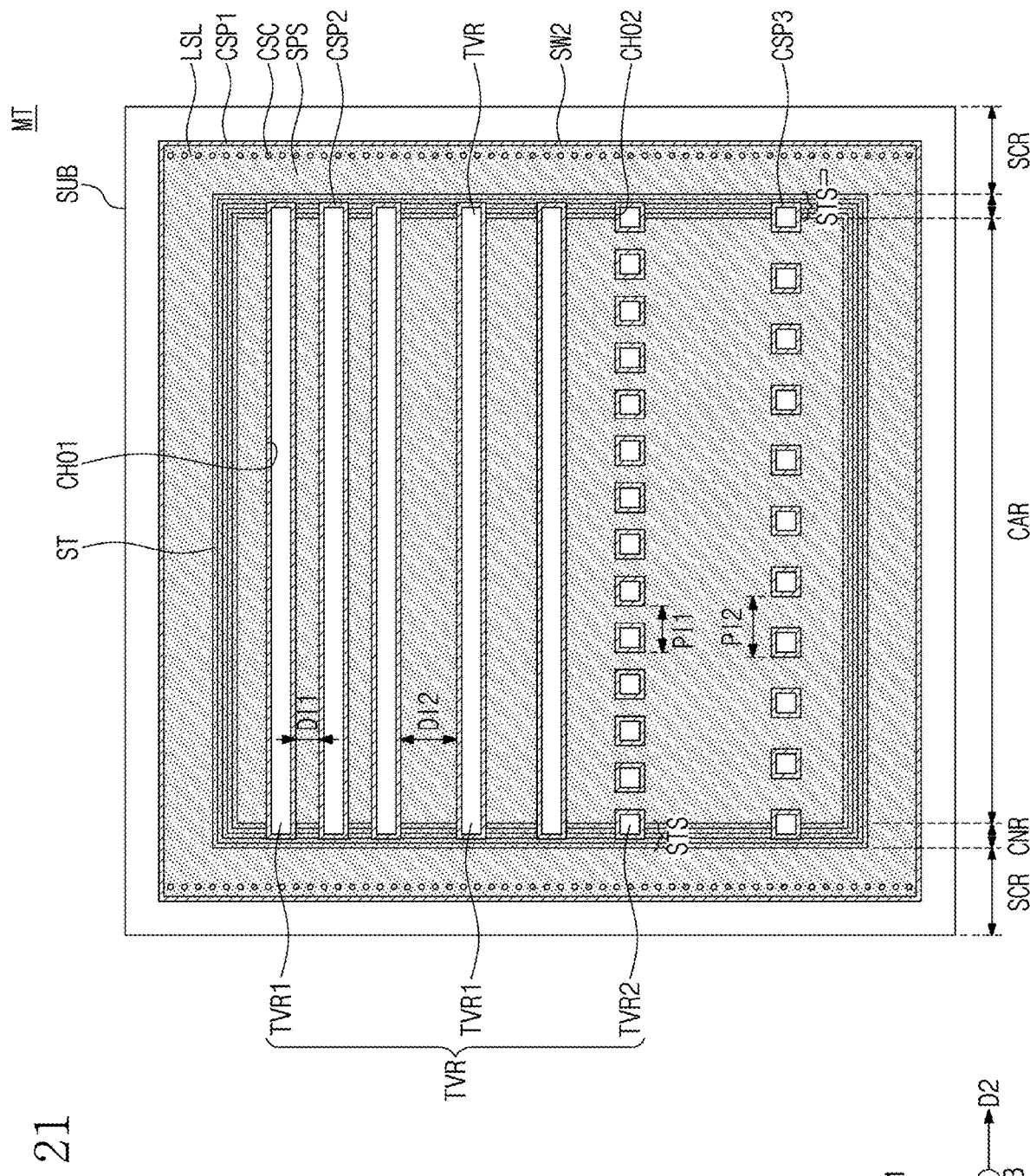
FIG. 21 is a plan view illustrating a 3D semiconductor memory device according to some example embodiments of the inventive concepts.

FIG. 21 is a plan view illustrating a 3D semiconductor memory device according to some example embodiments of the inventive concepts. In the present example embodiments, the descriptions to the same components and technical features as in the example embodiments of FIGS. 3, 4A and 4B will be omitted for the purpose of ease and convenience in explanation. In other words, differences between the present example embodiments and the example embodiments of FIGS. 3, 4A and 4B will be mainly described hereinafter.

Referring to FIG. 21, through-contact regions TVR may include first through-contact regions TVR1 and second through-contact regions TVR2. Each of the first through-contact regions TVR1 may have a line shape extending in the second direction D2. Each of the second through-contact regions TVR2 may have a quadrilateral dot shape. The second through-contact regions TVR2 may be arranged in the second direction D2.

The second conductive spacer CSP2 may be provided in each of the first through-contact regions TVR1. The second conductive spacer CSP2 may be provided on a sidewall of a first cutting hole CHO1 defining the first through-contact region TVR1.

A third conductive spacer CSP3 may be provided in each of the second through-contact regions TVR2. The third conductive spacer CSP3 may be provided on a sidewall of a second cutting hole CHO2 defining the second through-contact region TVR2.

A distance between the first through-contact regions TVR1 adjacent to each other may be various. For example, a distance between some first through-contact regions TVR1 adjacent to each other in the first direction D1 may be a first distance DI1. A distance between other first through-contact regions TVR1 adjacent to each other in the first direction D1 may be a second distance DI2. The second distance DI2 may be greater than the first distance DI1.

The second through-contact regions TVR2 may be arranged at various pitches. For example, some second through-contact regions TVR2 may be arranged in the second direction D2 at a first pitch P1. Other second through-contact regions TVR2 may be arranged in the second direction D2 at a second pitch P2. The second pitch P2 may be greater than the first pitch P1.

The third conductive spacers CSP3 may be provided in the second through-contact regions TVR2, respectively, and thus the amount of a metal member attached to the second substrate SL may be further increased. As a result, the third conductive spacers CSP3 may effectively reduce the resistance of the second substrate SL.

Figure 22:
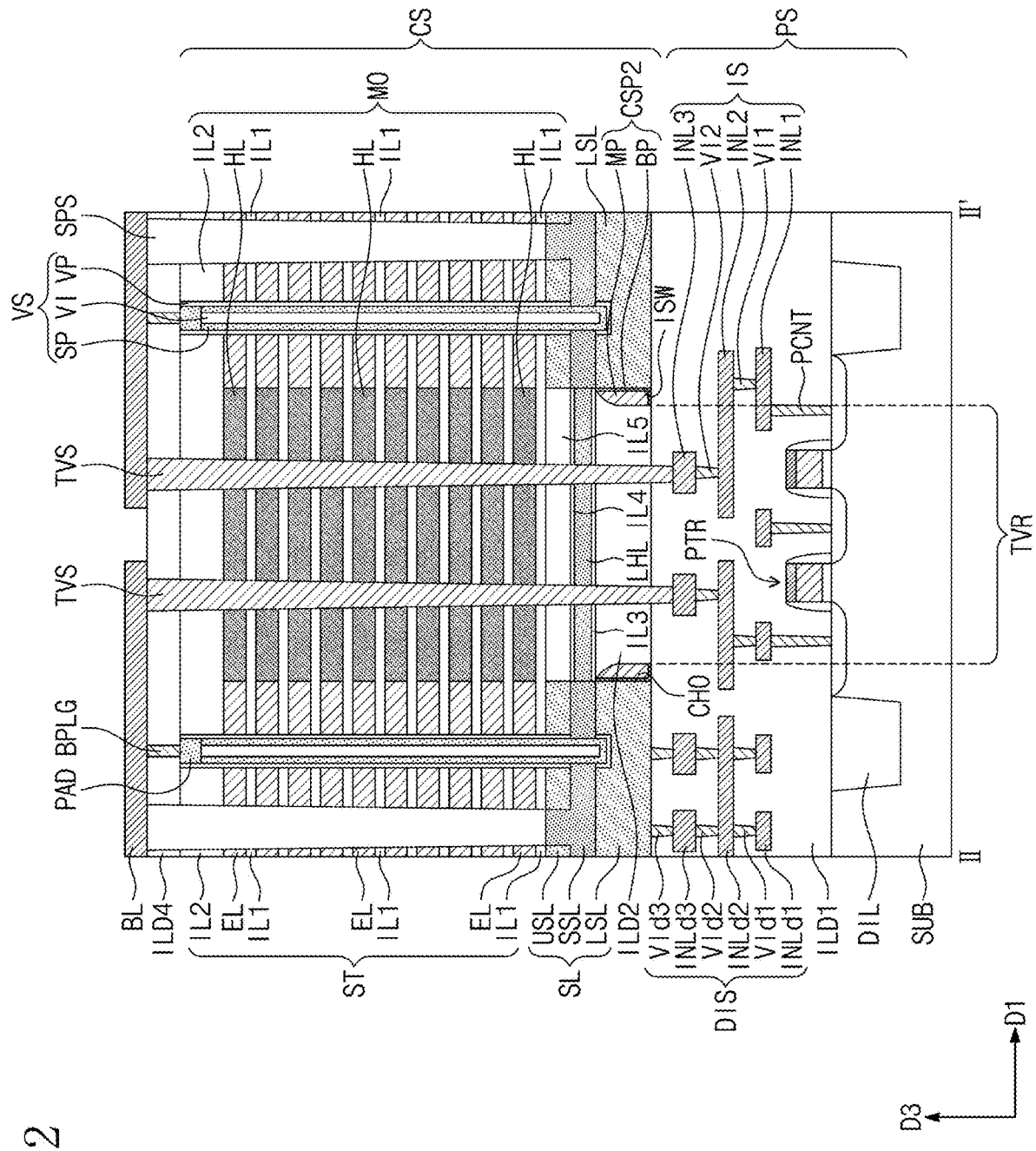
FIG. 22 is a cross-sectional view taken along the line II-II' of FIG. 3 to illustrate a 3D semiconductor memory device according to some example embodiments of the inventive concepts.

FIG. 22 is a cross-sectional view taken along the line II-II' of FIG. 3 to illustrate a 3D semiconductor memory device according to some example embodiments of the inventive concepts. In the present example embodiments, the descriptions to the same components and technical features as in the example embodiments of FIGS. 3, 4A and 4B will be omitted for the purpose of ease and convenience in explanation. In other words, differences between the present example embodiments and the example embodiments of FIGS. 3, 4A and 4B will be mainly described hereinafter.

Referring to FIG. 22, in some example embodiments, the second conductive spacer CSP2 may include a metal pattern MP and a barrier pattern BP. The barrier pattern BP may be disposed between the metal pattern MP and the inner sidewall ISW of the lower semiconductor layer LSL. The barrier pattern BP may also be disposed between the metal pattern MP and the top surface of the first interlayer insulating layer ILD1.

The barrier pattern BP may improve adhesive strength between the metal pattern MP and the lower semiconductor layer LSL and adhesive strength between the metal pattern MP and the first interlayer insulating layer ILD1. The barrier pattern BP may reduce or prevent diffusion of a metal of the metal pattern MP. For example, the barrier pattern BP may include at least one of Ti, TiN, or WN.

Figure 23:
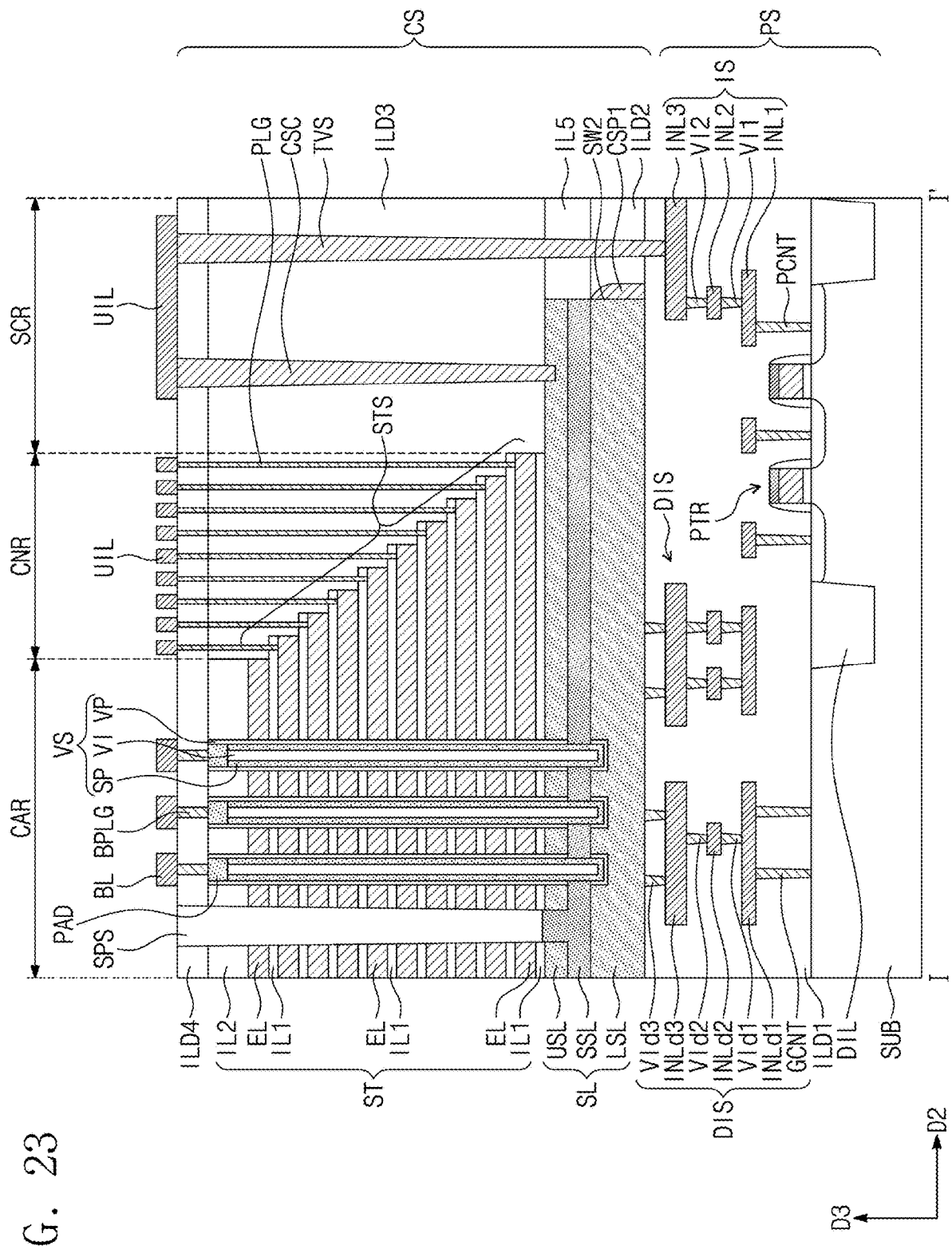
FIG. 23 is a cross-sectional view taken along the line I-I' of FIG. 3 to illustrate a 3D semiconductor memory device according to some example embodiments of the inventive concepts.

FIG. 23 is a cross-sectional view taken along the line I-I' of FIG. 3 to illustrate a 3D semiconductor memory device according to some example embodiments of the inventive concepts. In the present example embodiments, the descriptions to the same components and technical features as in the example embodiments of FIGS. 3, 4A and 4B will be omitted for the purpose of ease and convenience in explanation. In other words, differences between the present example embodiments and the example embodiments of FIGS. 3, 4A and 4B will be mainly described hereinafter.

Referring to FIG. 23, at least one of the dummy interconnection structures DIS may further include at least one ground contact GCNT. The ground contact GCNT may be provided between the first dummy interconnection line INLd1 and the first substrate SUB to electrically connect the first dummy interconnection line INLd1 to the first substrate SUB. In other words, the at least one dummy interconnection structure DIS may be connected to the first substrate SUB as well as the second substrate SL. The second substrate SL may be electrically connected to the first substrate SUB through the at least one dummy interconnection structure DIS.

At least another of the dummy interconnection structures DIS may not include the ground contact GCNT. In other words, the at least other dummy interconnection structure DIS may be connected to the second substrate SL but may not be connected to the first substrate SUB.

Figure 24:
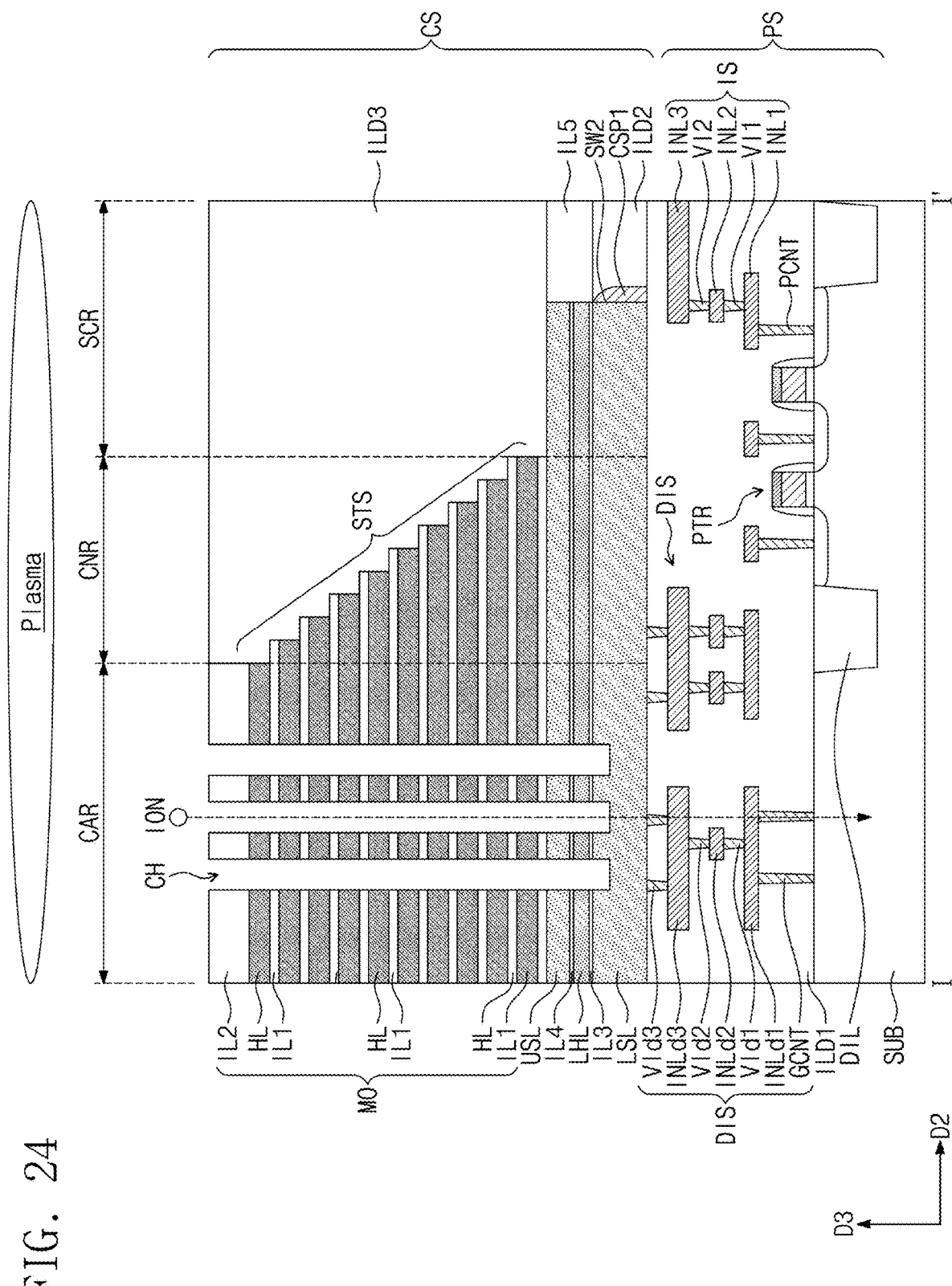
FIG. 24 is a cross-sectional view taken along the line I-I' of FIG. 3 to illustrate a method of manufacturing a 3D semiconductor memory device, according to some example embodiments of the inventive concepts.

FIG. 24 is a cross-sectional view taken along the line I-I' of FIG. 3 to illustrate a method of manufacturing a 3D semiconductor memory device, according to some example embodiments of the inventive concepts.

Referring to FIG. 24, channel holes CH may be formed in the resultant structure described above with reference to FIGS. 3, 7A and 7B. As described above, the channel holes CH may be formed using the anisotropic etching process using high-power plasma. In the anisotropic etching process, positive charges induced from ions ION and/or radicals included in the plasma may be charged in the second substrate SL exposed through the channel holes CH.

While a 3D semiconductor memory device according to the present example embodiments is manufactured, the first substrate SUB may be located on a supporter (not shown) of a semiconductor manufacturing apparatus. During the anisotropic etching process for forming the channel holes CH, a ground voltage may be applied to the first substrate SUB from the supporter.

The dummy interconnection structure DIS may electrically connect the second substrate SL to the first substrate SUB through the ground contact GCNT. Thus, the ground voltage may be applied to the second substrate SL from the supporter and the first substrate SUB during the anisotropic etching process. As a result, the positive charges induced from the ions ION and/or the radicals may be discharged to the outside through the first substrate SUB during the anisotropic etching process using the plasma (e.g., during the formation of the channel holes CH). According to example embodiments of the inventive concepts, it is possible to reduce or prevent arcing from occurring during the process of forming the channel holes CH.

According to example embodiments of the inventive concepts, metal members of various shapes may be connected to the second substrate of the cell array structure, and thus the resistance of the second substrate may be reduced. Therefore, the common source voltage may be smoothly applied to channels of the cell array structure. As a result, electrical characteristics of the 3D semiconductor memory device according to the inventive concepts may be improved.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:
  a peripheral circuit structure on a first substrate;
  a second substrate on the peripheral circuit structure;
  an electrode structure including a plurality of electrodes stacked on the second substrate; and
  a vertical channel structure penetrating the electrode structure,
  wherein the peripheral circuit structure comprises a dummy interconnection structure under the second substrate, and
  wherein the dummy interconnection structure comprises:
  at least one interconnection line; and
  a plurality of vias electrically connecting a top surface of the at least one interconnection line to a bottom surface of the second substrate.

2. The 3D semiconductor memory device of claim 1, wherein the at least one interconnection line includes a first interconnection line and a second interconnection line which are adjacent to each other, and
  wherein the first and second interconnection lines are spaced apart from each other by an interlayer insulating layer therebetween.

3. The 3D semiconductor memory device of claim 1, wherein the peripheral circuit structure further comprises a peripheral transistor constituting a peripheral logic circuit, and
  wherein the dummy interconnection structure is not connected to the peripheral transistor.

4. The 3D semiconductor memory device of claim 1, further comprising:
  a cutting hole penetrating the second substrate, the cutting hole extending in one direction and defining an inner sidewall of the second substrate; and
  a conductive spacer on the inner sidewall.

5. The 3D semiconductor memory device of claim 4, wherein the electrode structure further includes a mold structure on the cutting hole,
  the 3D semiconductor memory device further comprises a through-contact penetrating the mold structure so as to be connected to the peripheral circuit structure.

6. The 3D semiconductor memory device of claim 1, wherein the second substrate comprises a lower semiconductor layer; and a source semiconductor layer on the lower semiconductor layer, and
  wherein the vertical channel structure is connected to the source semiconductor layer.

7. The 3D semiconductor memory device of claim 6, further comprising a conductive pattern in a hole penetrating the lower semiconductor layer,
  wherein a top surface of the conductive pattern is substantially coplanar with a top surface of the lower semiconductor layer, and
  wherein the conductive pattern includes a metal.

8. The 3D semiconductor memory device of claim 1, wherein the plurality of electrodes of the electrode structure and the vertical channel structure penetrating the plurality of electrodes constitute memory cells three-dimensionally arranged.

9. The 3D semiconductor memory device of claim 1, wherein the second substrate has a cell array region, a connection region, and a source connection region,
  wherein the connection region is between the cell array region and the source connection region,
  wherein the vertical channel structure is on the cell array region, and
  wherein the electrode structure has a staircase structure on the connection region.

10. The 3D semiconductor memory device of claim 9, further comprising:
  an interlayer insulating layer covering the electrode structure;
  a common source contact penetrating the interlayer insulating layer so as to be connected to the source connection region;
  a through-contact penetrating the interlayer insulating layer so as to be connected to the peripheral circuit structure under the source connection region; and an upper interconnection line on the interlayer insulating layer to connect the common source contact and the through-contact.

11. The 3D semiconductor memory device of claim 10, further comprising:
a conductive spacer on one sidewall of the second substrate,
wherein the source connection region is adjacent to the one sidewall of the second substrate, and
wherein the through-contact is in contact with the conductive spacer.

12. A three-dimensional (3D) semiconductor memory device comprising:
a peripheral circuit structure on a first substrate;
a second substrate on the peripheral circuit structure;
an electrode structure including a plurality of electrodes stacked on the second substrate; and
a vertical channel structure penetrating the electrode structure,
wherein the peripheral circuit structure comprises a dummy interconnection structure under the second substrate,
wherein the dummy interconnection structure comprises at least one interconnection layer,
wherein the at least one interconnection layer comprises a first interconnection line and a second interconnection line,
wherein the first and second interconnection lines are electrically connected to the second substrate, and
wherein the first and second interconnection lines are spaced apart from each other by an interlayer insulating layer therebetween.

13. The 3D semiconductor memory device of claim 12, wherein the first and second interconnection lines have line shapes extending in parallel to each other.

14. The 3D semiconductor memory device of claim 12, wherein the dummy interconnection structure further comprises a plurality of vias between the second substrate and the first interconnection line, and
wherein the plurality of vias connect a top surface of the first interconnection line to a bottom surface of the second substrate.

15. The 3D semiconductor memory device of claim 12, wherein the peripheral circuit structure further comprises:
a peripheral transistor constituting a peripheral logic circuit; and
an interconnection structure connected to the peripheral transistor,
wherein the dummy interconnection structure is not connected to the peripheral transistor.

16. The 3D semiconductor memory device of claim 15, further comprising:
a cutting hole penetrating the second substrate;
a conductive spacer on an inner sidewall of the second substrate defined by the cutting hole; and
a through-contact penetrating the electrode structure on the cutting hole so as to be connected to the interconnection structure.

17. A three-dimensional (3D) semiconductor memory device comprising:

a peripheral circuit structure on a first substrate, the peripheral circuit structure including a peripheral transistor on the first substrate, an interconnection structure on the peripheral transistor, and a dummy interconnection structure adjacent to the interconnection structure;
a second substrate on the peripheral circuit structure;
an electrode structure including a plurality of electrodes stacked on the second substrate;
a plurality of vertical channel structures penetrating the electrode structure, the vertical channel structures electrically connected to the second substrate;
conductive pads on the vertical channel structures, respectively;
an interlayer insulating layer covering the electrode structure;
bit lines on the interlayer insulating layer and electrically connected to the conductive pads; and
a through-contact penetrating the interlayer insulating layer so as to be connected to the interconnection structure,
wherein each of the vertical channel structures comprises:
a filling insulation pattern having a pillar shape;
a vertical semiconductor pattern covering an outer surface of the filling insulation pattern; and
a data storage layer between the vertical semiconductor pattern and the plurality of electrodes,
wherein the dummy interconnection structure comprises:
at least one interconnection layer between the first substrate and the second substrate; and
a plurality of vias electrically connecting the at least one interconnection layer to the second substrate.

18. The 3D semiconductor memory device of claim 17, wherein the plurality of vias connect a top surface of an interconnection line of the at least one interconnection layer to a bottom surface of the second substrate.

19. The 3D semiconductor memory device of claim 17, further comprising:
a cutting hole penetrating the second substrate, the cutting hole extending in one direction and defining an inner sidewall of the second substrate; and
a conductive spacer on the inner sidewall.

20. The 3D semiconductor memory device of claim 17, wherein the second substrate has a cell array region, a connection region, and a source connection region,
wherein the connection region is between the cell array region and the source connection region,
wherein the plurality of vertical channel structures are on the cell array region, and
wherein the electrode structure has a staircase structure on the connection region,
the 3D semiconductor memory device further comprises:
a common source contact penetrating the interlayer insulating layer so as to be connected to the source connection region; and
an upper interconnection line on the interlayer insulating layer to connect the common source contact and the through-contact.

* * * * *